(12) United States Patent
Goebel

(10) Patent No.: US 12,489,187 B2
(45) Date of Patent: Dec. 2, 2025

(54) MICROWAVE SYSTEM AND APPARATUS

(71) Applicant: Uhland Goebel, Senden (DE)

(72) Inventor: Uhland Goebel, Senden (DE)

( * ) Notice: Subject to any disclaimer, the term of this patent is extended or adjusted under 35 U.S.C. 154(b) by 776 days.

(21) Appl. No.: 17/776,886

(22) PCT Filed: Nov. 13, 2020

(86) PCT No.: PCT/EP2020/081996
§ 371 (c)(1),
(2) Date: May 13, 2022

(87) PCT Pub. No.: WO2021/094506
PCT Pub. Date: May 20, 2021

(65) Prior Publication Data
US 2022/0407204 A1 Dec. 22, 2022

(30) Foreign Application Priority Data
Nov. 14, 2019 (EP) ..................................... 19209289

(51) Int. Cl.
*H01P 3/12* (2006.01)
*H01L 23/00* (2006.01)
(Continued)

(52) U.S. Cl.
CPC ............ *H01P 3/12* (2013.01); *H01L 23/3107* (2013.01); *H01L 24/02* (2013.01); *H01L 24/16* (2013.01);
(Continued)

(58) Field of Classification Search
CPC ... H01P 3/12; H01P 5/12; H01P 5/107; H01L 23/3107; H01L 24/02; H01L 24/16;
(Continued)

(56) References Cited

U.S. PATENT DOCUMENTS 9,257,735 B2 * 2/2016 Fakharzadeh ........... H01P 5/107
2012/0256796 A1 10/2012 Leiba
(Continued)

FOREIGN PATENT DOCUMENTS

| EP | 2 290 741 A1 | 3/2011 |
| EP | 2 333 828 A1 | 6/2011 |
| WO | 2016/098340 A1 | 6/2016 |

OTHER PUBLICATIONS

International Search Report with Written Opinion for related Application No. PCT/EP2022/081996, dated Feb. 15, 2021 (11 Pages).

*Primary Examiner* — Jonathan Han
(74) *Attorney, Agent, or Firm* — Michael Best & Friedrich LLP

(57) ABSTRACT

A microwave system includes a molding compound layer having opposing first and second surfaces, an integrated circuit device at least partially surrounded by said molding compound layer to define a fan-out area located laterally outside the integrated circuit device's outline, a plurality of through-mold vias within said fan-out area extending through said molding compound layer between said first and second surfaces, a re-distribution layer stack extending parallel to said second surface and comprising conducting signal paths, and a substrate comprising a first surface extending parallel to the molding compound layer. The re-distribution layer stack is positioned on top of an array of solder balls carried by the substrate. The system also includes two coupling slots arranged on different levels to resonantly couple with each other, and at least one hollow waveguide with an open (coupling) aperture at one end in direct proximity of one of said two coupling slots.

20 Claims, 17 Drawing Sheets

(51) Int. Cl.
    *H01L 23/31*     (2006.01)
    *H01P 5/12*     (2006.01)

(52) U.S. Cl.
    CPC ...... *H01P 5/12* (2013.01); *H01L 2224/02331* (2013.01); *H01L 2224/02379* (2013.01); *H01L 2224/16225* (2013.01)

(58) Field of Classification Search
    CPC . H01L 2224/02331; H01L 2224/02379; H01L 2224/16225
    See application file for complete search history.

(56) References Cited

U.S. PATENT DOCUMENTS

2015/0270616 A1*   9/2015   Jafarlou ................ H01Q 13/02
                                                      29/601
2016/0190670 A1     6/2016   Carmon et al.

\* cited by examiner

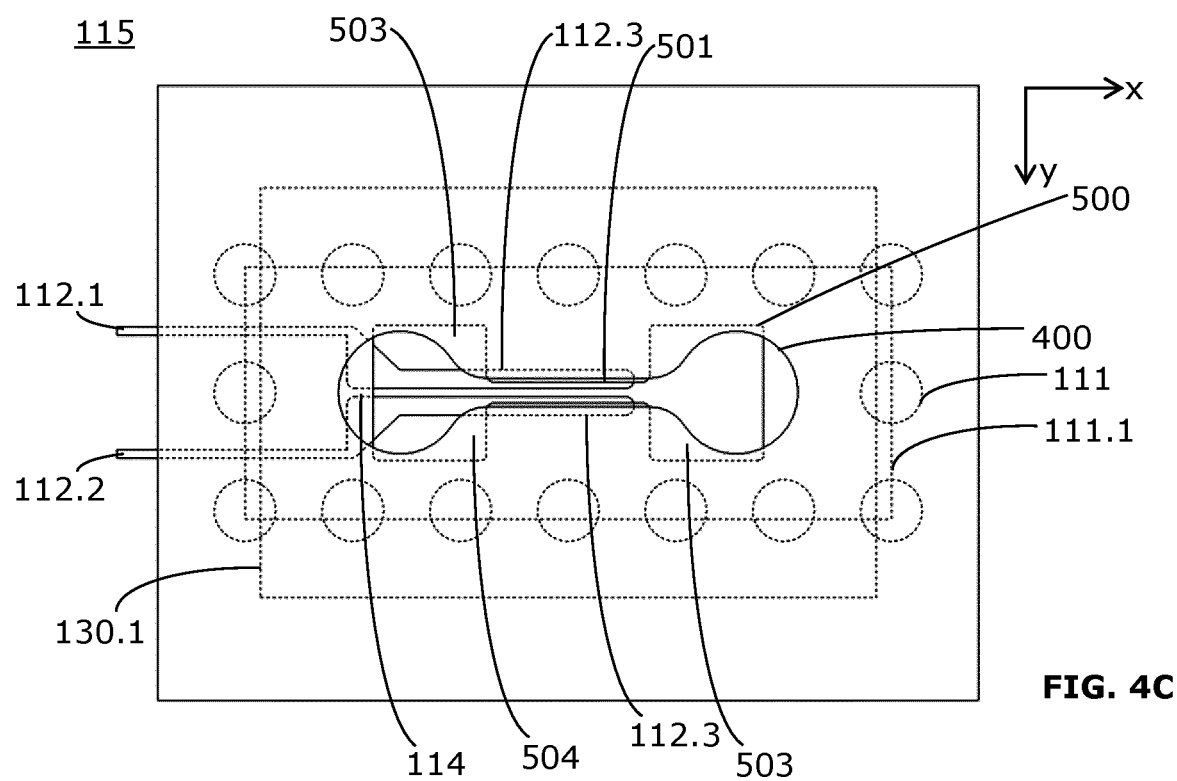

MICROWAVE SYSTEM AND APPARATUS

The present application is a national phase application of International Patent Application No. PCT/EP2020/081996, filed Nov. 13, 2020, which claims the priority of the European patent application EP19209289.8 filed on 14 Nov. 2019, the entire contents of which are incorporated by reference herein.

FIELD OF THE INVENTION

The present invention concerns a microwave system and a microwave apparatus.

In particular, the present invention concerns solutions for directly coupling wafer-level packaged circuits to hollow waveguides. A microwave system and a microwave apparatus can be used as part of an active radar antenna apparatus and radar system.

The present invention relates to integrated circuits for radar and communication systems in the microwave and millimeterwave range, that have a wafer-level package intended for Surface-mount Technology (SMT) assembly on a printed circuit board.

BACKGROUND

For several years since the introduction of automotive radar sensors, planar antenna arrays, integrated on the same multilayer printed circuit board as the radio frequency (RF) active front end circuitry have been regarded a sufficient and most cost-effective solution.

While the level of integration of transmit- and receive functions together with analog/digital conversion circuits, with signal- and clock generation and signal pre-processing as well has dramatically increased, the associated sensor antenna subsystem cannot follow this trend for miniaturization. Size and spacing of antenna elements are related to the operating frequency, to the intended range and the angular resolution. Increased angular resolution of present and future automotive radar sensors result in even increasing overall antenna aperture size and in subdivision into many subarrays for the purpose of electronic beam forming and for combining multiple operating modes. On the active front end side, monolithically integrated circuits have e.g. 3 transmit signal ports and 4 receive signal ports integrated on a single chip, tending towards integration of 12, 16 or even 24 channels per chip.

The trends to a) integrate more independent RF channels into one Monolithic Microwave Integrated Circuit (MMIC) package and b) to increase the overall antenna aperture for high angular resolution and larger radar range, result in increasing transmission line lengths between active circuit and antenna element or subarray, which reduces net transmitted power and receiver sensitivity—especially, when planar transmission lines on the surface of the electronic system board are used.

As a remedy, waveguide-based antenna architectures and subsystems are getting more popular again (due to the lower loss per physical length, e.g. measured in dB/mm). These need to be connected to the narrow-spaced signal ports of an integrated chip (IC), such as the chip of a hybrid MMIC package.

One way to solve the above task is to only leave a short track of planar transmission line (e.g. microstrip or coplanar waveguide) on the system board, for interconnecting each IC signal port with a respective planar transmission line-to-waveguide coupler, which is placed in a certain, sufficiently large radial distance to the IC. It is important, though, for proper function of radar sensors (also throughout the large temperature range encountered by the motor vehicle using it), to keep the planar transmission line lengths approximately equal and at a minimum. The number and sizes of the waveguides, which represent the antenna subsystem ports, determine the minimum radial distance, in which they can be placed adjacent to each other.

An especially suitable and cost-efficient package is the embedded wafer level ball grid array (eWLB) package, which uses solder balls arranged in a grid array (BGA) to connect to a printed circuit board (PCB) with either a single-ended ground-signal-ground (GSG) RF port configuration or a ground-signal(+)-signal(−)-ground (GSSG) balanced configuration.

Typical ball grid pitches of known solutions (standardized packages) range from 0.3 mm to 0.65 mm (0.3; 0.4; 0.5 and 0.65 mm are most commonly used). The lateral distance of signal contacts on the IC itself is usually much smaller than the external contact pitch of the package. Due to reliability reasons and for sake of the cost of fabrication (depending on production yield), packages very often need to be larger than the IC itself. The eWLB package as a variant of the Fan-Out Wafer Level Packages (FOWLP) solves this issue by extending the BGA beyond the IC area.

An example of a known eWLB approach for the integration of an IC 12 inside a molding compound layer 11 is shown in FIGS. 1A and 1B. FIG. 1A shows a schematic cross section of a portion of a respective apparatus 10 and FIG. 1B shows a schematic top view. The IC 12 is typically embedded "inside" a layer 11 comprising a molding compound. One distinguishes the area right above the IC 12 from the area outside the boundaries of the IC 12. The area above the IC 12 is called fan-in area FI and the area around the IC 12 is called fan-out area FO. The IC 12 typically comprises chip ports (not shown in FIG. 1A) on its bottom side. In order to contact these ports, there is at least one re-distribution layer 14 which comprises conducting signal paths and metal pads, for example. In FIG. 1A, these signal paths and metal pads are designated by the reference number 15. In order to be able to mount this apparatus 10 on a multilayer printed circuit board (not shown in FIG. 1A) and to electrically connect the printed circuit board with the node of the IC 12, it is known to employ solder balls 13.

FIG. 1B illustrates that the IC 12 typically has a smaller footprint than the molding compound layer 11. The outline of the molding compound layer 11 is here defined by the longitudinal edges 11.*l* and the transversal edges 11.*t*.

In the following sections, two examples of FOWLP solutions are presented, which are considered to be specific embodiments or adaptations of the apparatus of FIG. 1A, 1B.

The paper "A Non-galvanic D-band MMIC-to-Waveguide Transition Using eWLB Packaging Technology", A. Hassona et al., IEEE, 2017, pages 510-512, addresses a specific embodiment where a waveguide is coupled to such an apparatus 10. The embodiment is depicted in FIG. 2 and it comprises a re-distribution layer stack 14 instead of a single re-distribution layer. The re-distribution layer stack 14 may comprise a dielectric separation layer 16, for example to provide for an electric insulation of an upper and a lower re-distribution layer inside the stack 14.

The printed circuit board 17 (PCB 17) is situated underneath and it holds a waveguide 20 in place so that a thin, well defined air gap AG results between the upper end of the waveguide 20 and the lower most layer of the re-distribution layer stack 14. The design of this portion of the apparatus 10 is carried out so that an electromagnetic wave is coupled out of the re-distribution layer stack 14 into the waveguide 20. The waveguide 20 as such has longitudinal axis extending perpendicularly with respect to the planes of the re-distribution layer stack 14. The arrow P inside the waveguide 20 indicates the propagation direction of a transmitted electromagnetic wave inside the waveguide 20.

The paper "3D rectangular waveguide integrated in embedded Wafer Level Ball Grid (eWLB) package", by E. Seler et al., published in 2014 IEEE 64$^{th}$ Electronic Components and Technology Conference (ECTC), 2014, discloses another specific embodiment where an electromagnetic wave is redirected inside the molding compound layer 11 so that it is radiated into the half-space above the fan-out area FO of the respective package. Like the embodiment of FIG. 2, the embodiment of FIG. 3 comprises a multi-layer re-distribution layer stack 14. In the present embodiment, the PCB 17 carries a metal reflector 31 on its top surface and there is an antenna 30 integrated into the re-distribution layer stack 14. This antenna 30, which otherwise would radiate into the full space (and into the PCB), interacts with the metal reflector 31. The metal reflector 31 reflects the wave so that it travels through the molding compound layer 11. At the upper surface of the molding compound layer 11 the electromagnetic wave is radiated, as illustrated by three arrows designed by the reference number RD.

While with the waveguide transition placed on a PCB 17, most of the transmission line lengths can be exchanged with low-loss waveguides, still the sequence MMIC-BGA-[planar transmission line]-waveguide is regarded sub-optimum, because still a relatively high-cost substrate of specifically low RF loss is required. Also, fabrication and material properties tolerances add up unfavorably and compromise the overall production yield.

A direct attachment between waveguide ports of the antenna subsystem and the respective MMIC ports of such a Fan-out wafer-level packaging (FOWLP) is highly desired, removing the need for low-loss PCB substrate materials and saving PCB real estate needed for chip-to-waveguide fan-out tracks and PCB-based waveguide transitions.

It is a disadvantage of known packaging solutions that the chip package area occupied per port is equivalent to the waveguide size including the wall thickness of the waveguide implementation.

It is a disadvantage of known packaging solutions, that it is difficult, if not impossible, to achieve fully shielded port arrangements which are mandatory for a channel-to-channel isolation well beyond 30 dB necessary for high-performance radar sensors and communication systems.

SUMMARY

It is thus an objective within the scope of this document to provide an efficient transition between the chip (IC) of a hybrid microwave and millimeterwave apparatus and a waveguide.

In accordance with at least some embodiments, a system and an apparatus are provided which establish a direct transition between an IC and an air-filled (hollow) waveguide.

In at least some embodiments, the system comprises
a molding compound layer having opposing first and second surfaces;
an integrated circuit device being at least partially surrounded by said molding compound layer so as to define a fan-out area located laterally outside of the outline of said integrated circuit device;
a plurality of through-mold vias within said fan-out area extending through said molding compound layer between said first and second surfaces;
a re-distribution layer stack extending parallel to said second surface and comprising conducting signal paths;
a substrate comprising a first surface extending parallel to the molding compound layer and an array of solder balls being situated between said substrate and said re-distribution layer stack.

This system is characterized in that it comprises:
two coupling slots being arranged on two different levels of the apparatus so as to resonantly couple with each other,
at least one hollow waveguide with an open (coupling) aperture, preferably an H-shaped aperture, at one end, this waveguide being arranged with the open (coupling) aperture in the direct proximity of one of said two coupling slots.

The present document concerns an advanced, compact and flexible system and/or apparatus being designed for use as part of a microwave or millimeter wave communication system in general and a (automotive) radar system in particular.

The system and/or apparatus, as presented herein, is designed to provide an efficient transition between an external hollow waveguide and a wafer-level packaged integrated circuit.

Systems and/or apparatus are presented which provide a low-loss and wideband interconnection between a planar signal path present on or in a re-distribution layer stack and hollow waveguides attached to the Fan-Out area of a Fan-Out Wafer Level Package (FOWLP).

The system and/or apparatus, as presented herein, is designed to provide
a very low overall transition loss,
a wide operational matching bandwidth beyond 20%,
a high adjacent channel isolation of at least 40 dB.

Furthermore, the system and/or apparatus, as presented herein, has the advantage that the same (small) channel pitch can be used as balanced GSSG BGA ports of existing eWLB integrated circuits.

The system and/or apparatus, as presented herein, has the advantage that it can be used in connection with integrated circuits having either single-ended or balanced chip ports or interfaces or a combination of both.

Furthermore, the system and/or apparatus, as presented herein can be altered so that an efficient signal connection between integrated circuits with a single-ended ground-signal-ground (GSG) port configuration or integrated circuits with a ground-signal(+)-signal(−)-ground (GSSG) balanced port configuration and a coupling slot is possible.

The system and/or apparatus, as presented herein, has the advantage that the waveguides attached to the upper coupling slot occupy a small footprint of the fan-out area of the package surface.

The present system and/or apparatus, in addition, can be designed so as to offer a test-jig interface for testing its full RF functionality. This allows an automated end-of-line testing without prior mounting to a substrate (e.g. a PCB).

It is another advantage of the system and/or apparatus presented herein, that the size of the dielectrically filled waveguide, which is fenced off by a plurality of through mold vias, is technologically decoupled from the pitch of the regularly arranged solder balls.

This summary is not exhaustive of the scope of the present aspects and embodiments. Thus, while certain aspects and embodiments have been presented and/or outlined in this summary, it should be understood that the present aspects and embodiments are not limited to the aspects and embodiments in this summary. Indeed, other aspects and embodiments, which may be similar to and/or different from, the aspects and embodiments presented in this summary, will be apparent from the description, illustrations and/or claims, which follow.

It should also be understood that any aspects and embodiments that are described in this summary and do not appear in the claims that follow are preserved for later presentation in this application or in one or more continuation patent applications. Other advantages and features will become apparent from the following detailed description, which are to be understood not to be limiting, are described in more detail below with reference to the drawings.

BRIEF DESCRIPTION OF THE DRAWINGS

FIG. 4C shows a transparent top view of the molding compound layer of the embodiment of FIG. 4A;

DETAILED DESCRIPTION

Figure 1A:
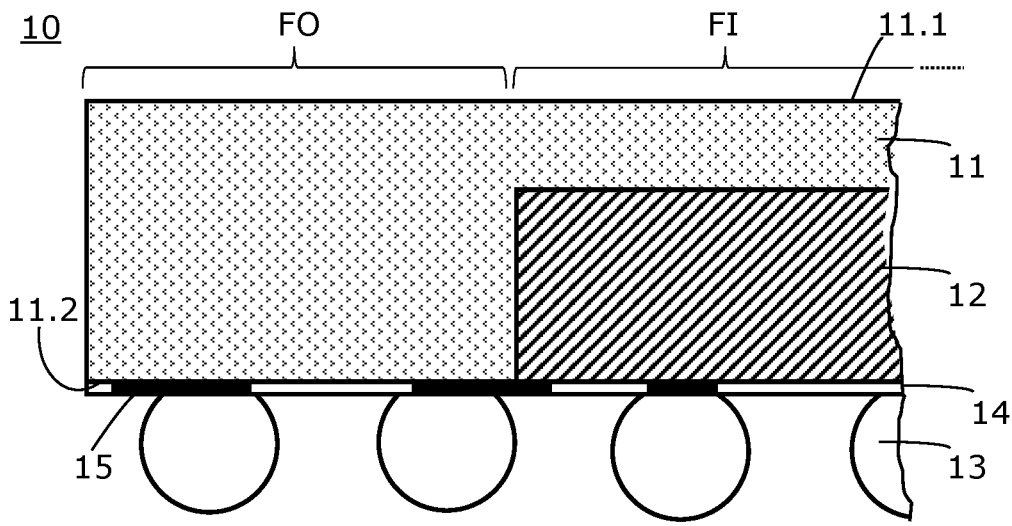
FIG. 1A shows a cross section of a portion of a device known in the art.
Figure 1B:
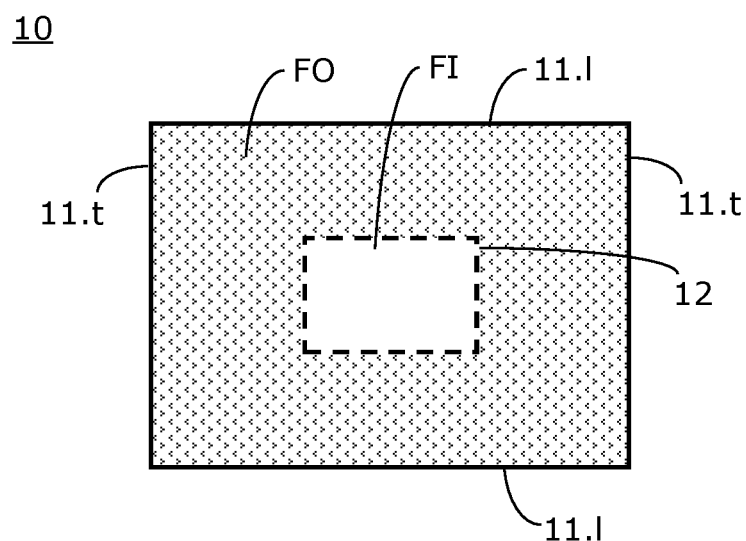
FIG. 1B shows a top view of the device of FIG. 1A.
Figure 2:
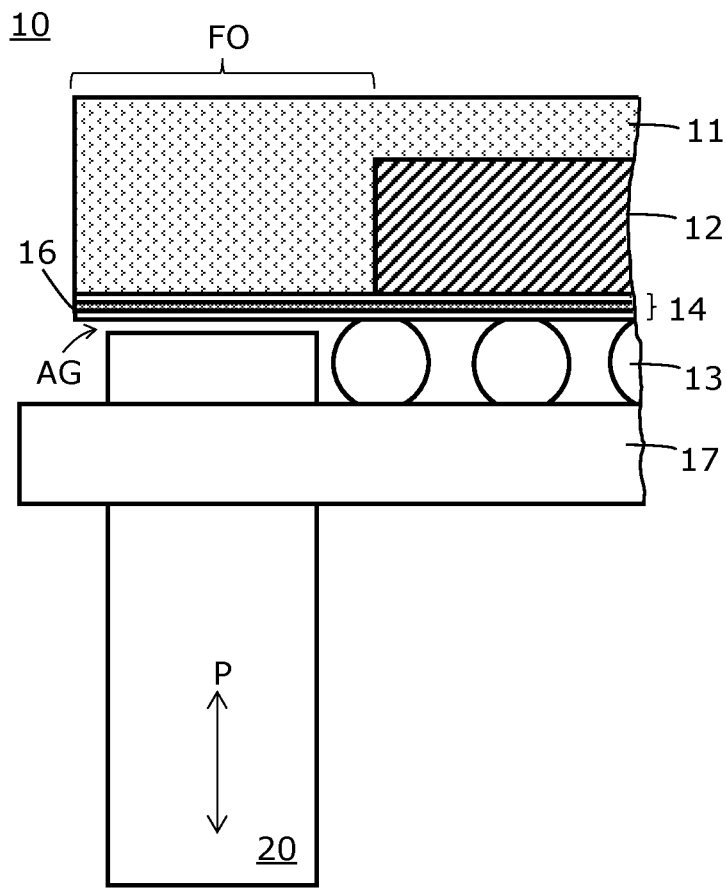
FIG. 2 shows a cross section of a portion of a device known in the art which comprises a printed circuit board and a waveguide in a perpendicular arrangement.
Figure 3:
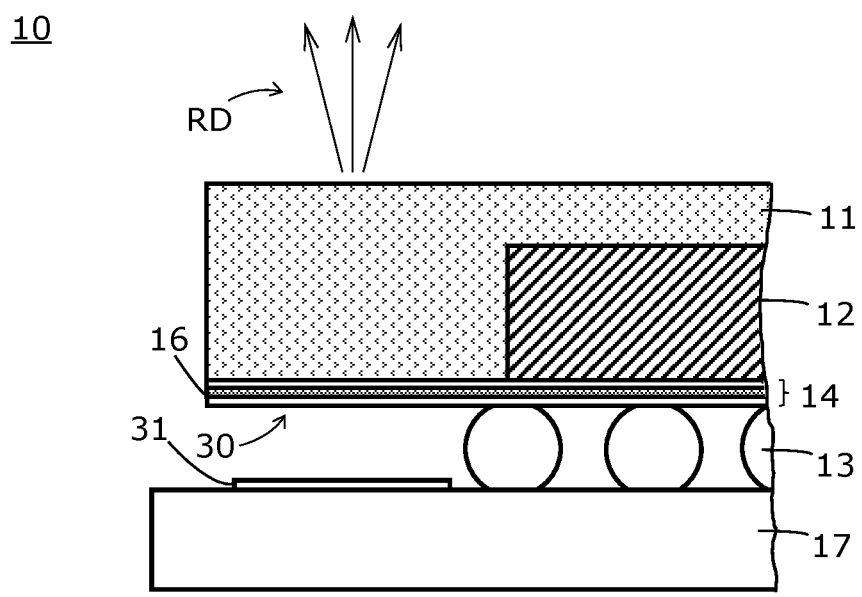
FIG. 3 shows a cross section of a portion of a device known in the art which comprises a printed circuit board and which is specifically designed to radiate a microwave into the space above the device.

In connection with the present description, terms are used which also find use in relevant publications and patents. It is noted however, that the use of these terms shall merely serve a better comprehension. The inventive idea and the scope of the patent claims shall not be limited in their interpretation by the specific selection of the terms. The invention can be transferred without further ado to other systems of terminology and/or technical areas. In other technical areas, the terms are to be employed analogously.

The present description uses directions and makes statements regarding the orientation of the essential elements or building blocks. These directions and orientations refer to the orientations of the respective figures. It goes without saying that, when turning an apparatus 100 or system 150 upside down, the respective directions and orientations have to be altered accordingly.

In the following not all details of all figures and embodiments are described. The figures and embodiments have a number of similarities and the same reference numbers are hereinafter used for functionally similar elements. The description of the respective elements applies to all other embodiments.

For the purposes of the present description and claims, some of the essential elements or building blocks of a system 150 are defined and described, before details of various embodiments are being addressed. A system 150 is considered to be an apparatus 100 plus at least one hollow waveguide 200 mounted on or attached to the apparatus 100.

The elements or building blocks of an apparatus 100 and system 150 are described in connection with the embodiment of FIG. 4A-4D, but the respective statements and remarks also apply to the other embodiments.

In the following, the word "microwave" is used. This word, however, is meant to include microwaves and millimeterwaves in the range between 20 GHz and 200 GHz (herein called the operational bandwidth or frequency range).

The present document concerns a hybrid apparatus 100 (herein apparatus 100) which comprises a number of layers and features or structures. A hybrid apparatus 10 combines two or more technologies and/or materials with the aim to achieve an efficient and robust overall system. An embedded wafer level package (eWLB) is an example of a hybrid apparatus 100.

For the purpose of the present document, an integrated circuit device 120 (herein IC 120) is a microwave semiconductor chip (such as a Monolithic Microwave Integrated Circuit, MMIC, for example). An apparatus 100 with an IC 120 is depicted in FIG. 18A, 18B and a system 150 with an apparatus 100 is depicted in FIG. 19.

Figure 18A:
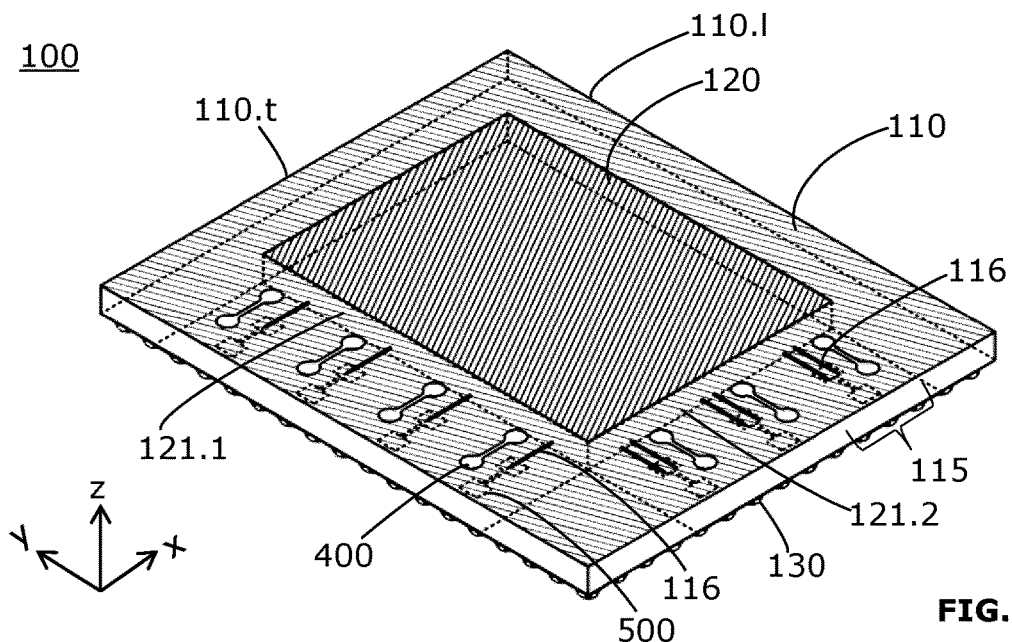
FIG. 18A shows a schematic perspective view of an embodiment of an apparatus (e.g. a 3Tx, 4Rx apparatus)
Figure 18B:
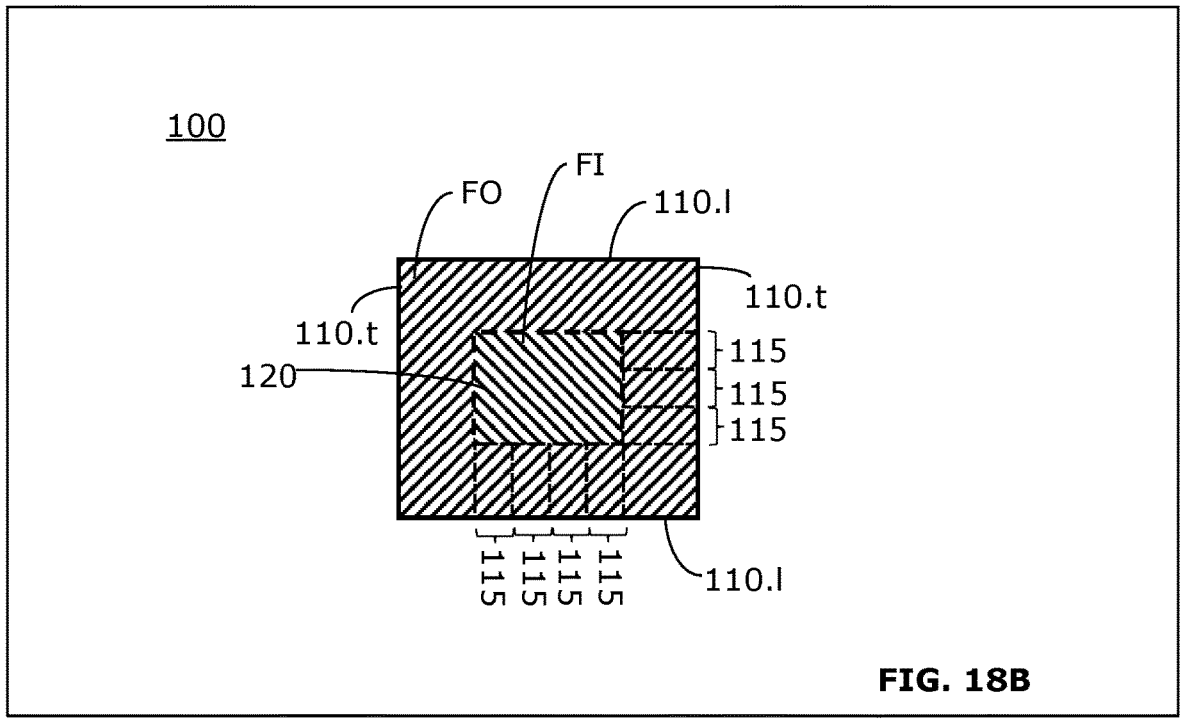
FIG. 18B shows a top view of the apparatus of FIG. 18A.
Figure 19:
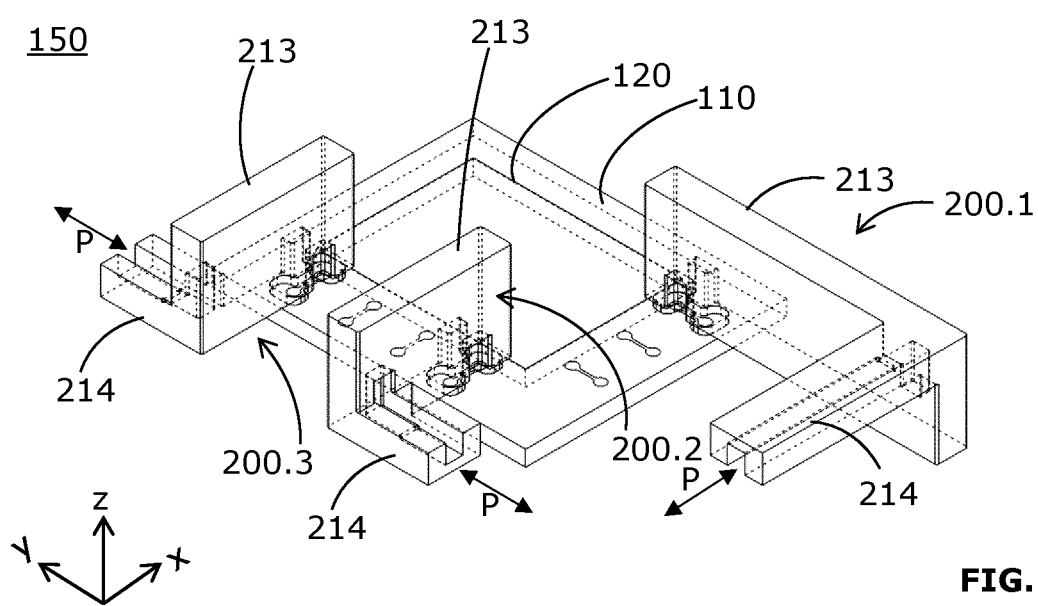
FIG. 19 shows a schematic perspective view of an embodiment of a system with three external waveguides.

The IC 120 is embedded in (e.g. by dispensing a liquid molding compound over the IC 120) or inserted into a molding compound layer 110 of the apparatus 100 (cf. FIG. 18A, 18B).

In at least some embodiments, the molding compound layer 110 comprises a molding compound or encapsulating material. In at least some embodiments, this compound or material is an electrically insulating material and may comprise or be a thermoset material or a thermoplastic material. In at least some embodiments, this compound or material is a polymer material, e.g. a duroplastic polymer material.

In at least some embodiments, the molding compound layer 110 has a thickness d1 in a range between 0.1 mm and 1 mm, preferably between 0.25 mm and 0.55 mm.

In at least some embodiments, the molding compound layer 110 has a thickness d1 (cf. FIGS. 4B, 8B-13B) which may range between ⅒ and ⅓ wavelengths of the electromagnetic wave inside the molding compound material.

In an intermediate fabrication step, the molding compound layer 110 is provided with a level (flush) lower surface 110.2 (cf. FIG. 4A, for example) with respect to the structured (functional) surface of the IC 120. This constellation is well known in the art and is thus not addressed in detail.

In at least some embodiments, a thin lower dielectric cover layer 184 (cf. FIGS. 4B and FIG. 5) covers both IC and molding compound surfaces.

The system 150 is designed so as to pick up a microwave signal at a single port or two coherent microwave signals at two adjacent ports of the IC 120 and to transform this signal or signals into a microwave waveguide signal travelling along an external hollow waveguide 200. In general, the circuits and materials employed in the apparatus 100 allow for reciprocal wave propagation. Therefore, the same system 150 can transform signals coming in from the hollow waveguide 200, transform them into a single signal or a coherent pair of signals and deliver these to a single or to a pair of ports of the IC 120.

That is, all embodiments of the system 150 can have several waveguide ports for receiving microwave waveguide signals and/or several waveguide ports for transmitting microwave waveguide signals. The remote ports (also called second waveguide ports) carry the reference number 212 and the ports close to the apparatus' upper surface (also called first waveguide ports) carry the reference number 211 (cf. FIGS. 6 and 7, for example).

The external waveguides 200, which can be arranged with respect to the fan-out area of the apparatus 100 in various ways, always have a first waveguide port 211, a second waveguide port 212, an aperture 210 positioned at the first waveguide port 211, an enlarged hollow waveguide portion or segment 213, and an optional hollow ridge-waveguide portion or segment 214 which typically has smaller dimensions than the enlarged hollow waveguide portion or segment 213.

Figure 4A:
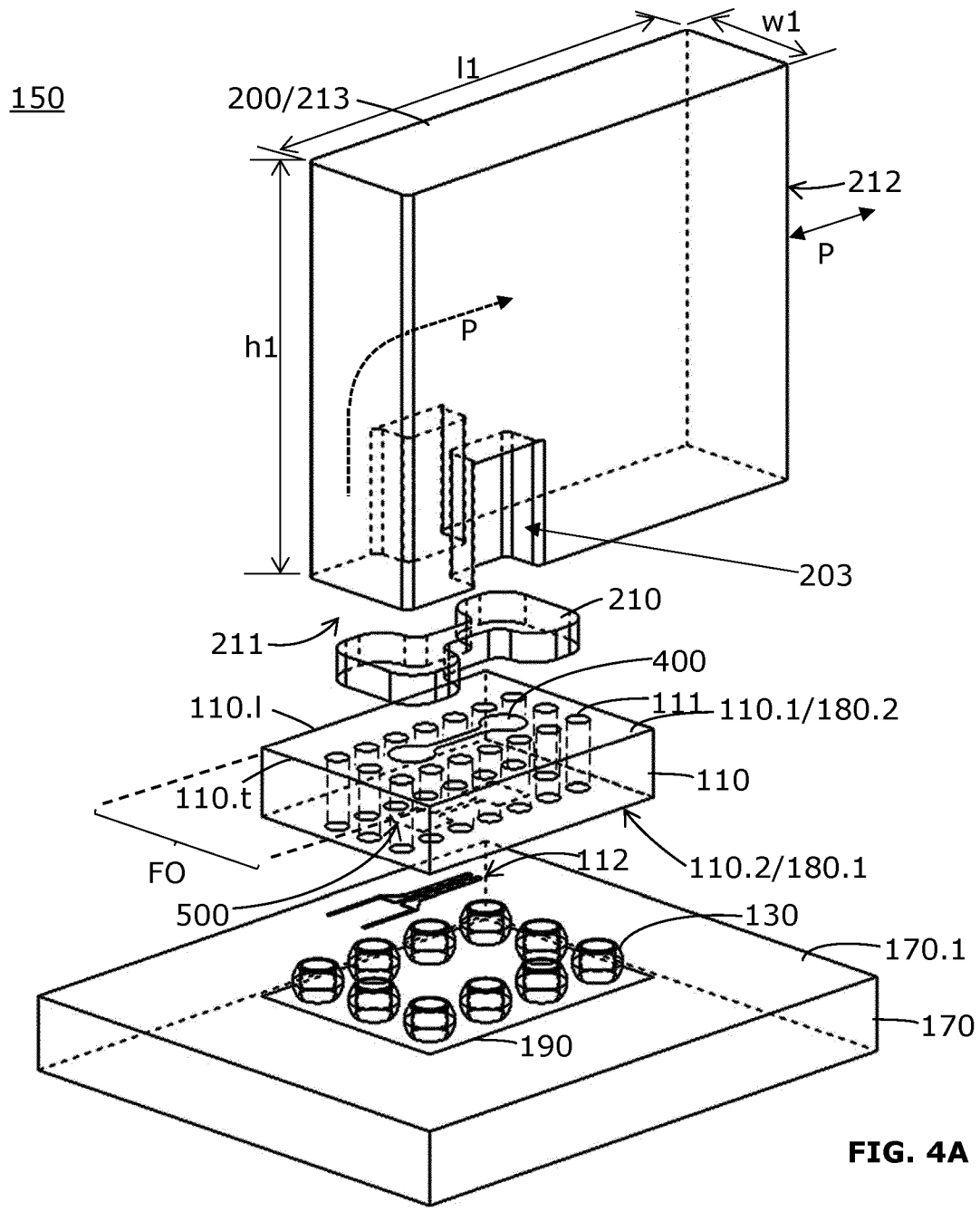
FIG. 4A shows an exploded perspective view of a first embodiment of a unit cell.

In at least some embodiments, the enlarged hollow waveguide portion or segment 213 essentially has the shape of a rectangular box with a width w1 (parallel to the x-axis), a height h1 (parallel to the z-axis), and a length l1 (parallel to the y-axis) (cf. FIG. 4A). That is, the enlarged hollow waveguide portion or segment 213 typically has four narrow sides or walls and two larger sides or walls. The size of the narrow sides or walls is defined by the width w1 and either the length l1 or the height h1. The size of the larger sides or walls is defined by the length l1 and the height h1. The following relations define the respective dimensions: w1<h1, and w1<l1.

An IC 120 typically comprises a plurality of signal ports or nodes (not shown) which are positioned/realized at the outer chip border 121.1, 121.2 (in FIG. 18 two of the chip borders carry the reference numbers 121.1, 121.2) and which typically have one of the following configurations:
  G-S-G (ground-signal-ground), referred to as "single-ended" port;
  G-Sp-Sn-G (ground-Psignal-Nsignal-ground), referred to as "balanced", "differential" or "push-pull" port;
  G-Sp-G-Sn-G (ground-Psignal-ground-Nsignal-ground), also referred to as "balanced", "differential" or "push-pull" port, alternative configuration.

The lateral mutual distance of the signal ports at the outer chip borders 121.1, 121.2 is typically much smaller than the realizable external port node distance, which varies with the Fan-Out BGA package pitch (typical ranges for the first distance is 10 μm to 100 μm, while the latter amounts to 0.3 mm to 0.65 mm, depending on IC supplier's preferences).

A unit cell 115 for the purpose of the present document is considered to be a functional building block which comprise an upper ground metallization with a slot 400, a lower ground metallization with a slot 500, a plurality of vias forming a via fence, a molding compound material enclosing these elements/features, a substrate 170 (e.g. a PCB) being situated below these elements/features so that there is an air gap inbetween, and conductive posts, pillars or balls (e.g. solder balls 130) defining a back-cavity for the coupling slot 500.

Figure 4B:
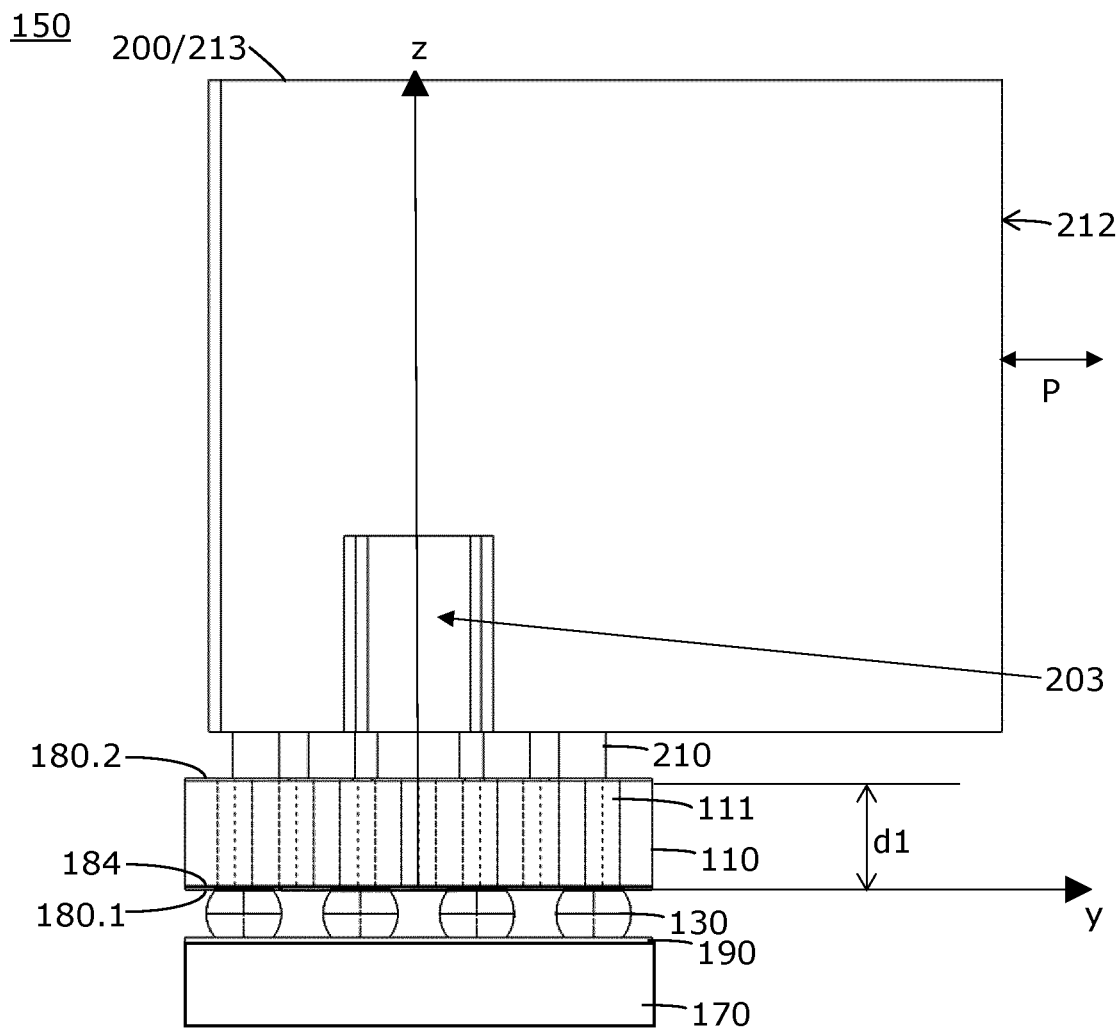
FIG. 4B shows a side view of the first embodiment.

In at least some embodiments, the molding compound layer 110 comprises a plurality of vias 111 (cf. FIG. 4B, for example). These vias 111 may be created (e.g. by laser-drilling or micro-drilling and a subsequent metallization) directly in the molding compound or encapsulating material of the molding compound layer 110. The vias 111 form a via fence, as will be addressed later.

It is to be noted that the unit cell 115, or a portion of such a unit cell 115 can be provided as a pre-fabricated (and tested) passive subcomponent. In at least some embodiments, such a pre-fabricated passive subcomponent might for example comprise an upper and a lower ground metallization, each being provided with a slot 400, 500, a plurality of vias forming a via fence, and a molding compound material enclosing these elements/features. One or more such a pre-fabricated passive subcomponent can for example be assembled together with an active IC 120 (e.g. during a back-end wafer process) before these elements are then encapsulated, for example.

The term "via 111" is meant to include all sorts of vias 111, independent of the fabrication method used and independent of the fact at what stage of the production the vias 111 are being fabricated.

In at least some embodiments, there is a re-distribution layer stack 140 (cf. FIG. 5, for example) which comprises at least one planar, electrically conducting signal path (e.g. the planar signal paths 112, 112.1, 112.2 of FIG. 4A, 4C, or the planar signal paths 116, 116.1, 116.2 of FIG. 8A-13A) embedded or realized in or on top of an insulating material or layer (e.g. the dielectric cover layer 184) of the layer stack 140.

Small openings in the thin dielectric cover layer 184 (e.g. produced by plasma etching) allow access to the IC's signal ports, which are then connected by a thin film (metal plating) process to planar signal paths (e.g. the planar signal paths 112, 112.1, 112.2 of FIG. 4A, 4C, or the planar signal paths 116, 116.1, 116.2 of FIG. 8A-13A) situated inside one (other) layer of the re-distribution layer stack 140. The respective layer of the re-distribution layer stack 140 is herein referred to as $1^{st}$ redistribution layer 182.

Some of the embodiments may comprise a $2^{nd}$ redistribution layer to offer additional flexibility as far as the routing of signal paths is concerned, but it is important to note that the concept presented herein works also well with a single re-distribution layer 182.

Using one or two redistribution layers, quasi-TEM transmission lines can be used as signal paths (e.g. the planar signal paths 112, 112.1, 112.2 of FIG. 4A, 4C, or the planar signal paths 116, 116.1, 116.2 of FIG. 8A-13A). Their configurations are chosen in correspondence to the respective port configuration on the IC 120. FIG. 18 shows an example where there are four short signal paths 116 situated at the longer chip border 121.1 and three short signal paths 116 situated at the shorter chip border 121.2.

Figure 8A:
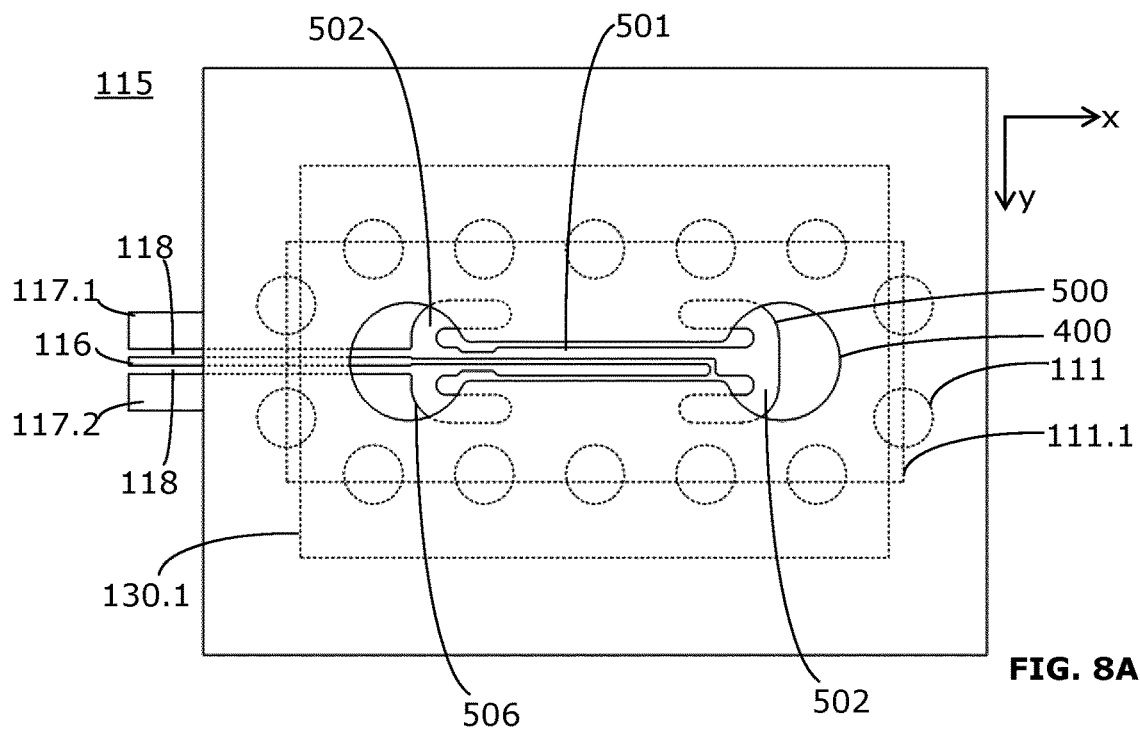
FIG. 8A shows a schematic top view of an embodiment of a unit cell.
Figure 8B:
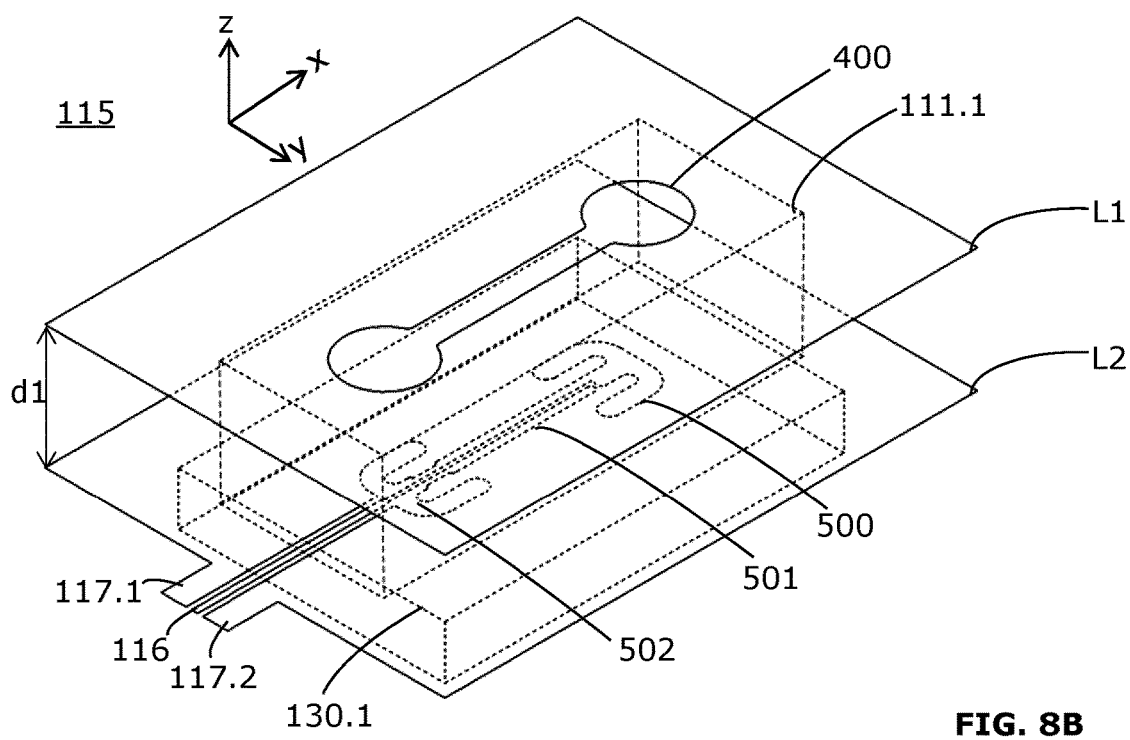
FIG. 8B shows a schematic perspective view of the embodiment of FIG. 8A.

For G-S-G signal ports of the IC 120, either a coplanar transmission line (the signal-carrying path 116 and the two ground-potential carrying paths 117.1, 117.2 are on the same redistribution layer, cf. FIG. 8A, 8B) or stripline/microstrip configurations are being used. In the latter cases, the ground potential can be either attributed to the $1^{st}$ redistribution layer 182 or to a $2^{nd}$ redistribution layer. If two redistribution layers are provided, the signal carrying conductor path 116 is then placed on the respective other redistribution layer.

For G-$S_p$-$S_n$-G signal ports of the IC 120, corresponding coplanar transmission line configurations with two signal-carrying paths 116.1, 116.2 and the two ground-potential carrying paths 117.1, 117.2 (cf. FIG. 9A, 9B) are preferred, while also two microstrip signal traces 116.1, 116.2 (cf. FIGS. 11A-13B) adjacent to each other, on top of a common ground plane on the other redistribution layer are possible. The microstrip version is less often used due to added cost of the $2^{nd}$ redistribution layer and the resulting smaller trace width. Also, the typically very thin (single digit μm values) dielectric isolation layer between the two redistribution layers also cause higher loss per length unit, when compared to coplanar transmission line.

For G-$S_p$-G-$S_n$-G signal ports of the IC 120, the useful coplanar transmission line configurations (not shown in any of the figures) feature an additional narrow ground track between the two differential signal paths 116.1, 116.2, which helps to improve the signal integrity and to reduce radiation losses in conjunction with rounded or angled direction changes along the routing path. Again, two independent microstrip signal traces adjacent to each other (not shown in any of the figures) can be used alternatively, if more than one redistribution layer is available.

It shall be noted, that two independent microstrip signal traces coupled to the same coupling slot 500 (cf. FIGS. 11A-13B) offer an option to also use non-coherent signals generated or received by independent circuits integrated on the IC 120. E.g. one of the microstrip signal traces can collect signals transmitted via the other for BIT (built-in-test) purposes, or it might inject test signals into a receiver circuit connected to the other trace.

In summary, signal paths 112, 112.1, 112.2, 116, 116.1, 116.2 entering the transition area of the unit cell 115 of the apparatus 100 are either single-ended (cf. FIGS. 8A, 8B, 10A, 10B), having a coplanar or a microstrip configuration, or balanced/differential with two signal paths 112.1, 112.2, 116.1, 116.2 either on the same redistribution layer as the ground potential plane, or two signal paths 116.1, 116.2 (cf. FIG. 9A, 9B, for example) adjacent to each other above a common ground plane in another redistribution layer plane.

In at least some embodiments, typical signal paths widths and the widths of slots (e.g. the slot 118 in FIG. 4C or 13A) between signal paths 116.1, 116.2 are in the 10 μm to 30 μm range.

In at least some embodiments, the system 150 and apparatus 100 comprises at least two superimposed coupling slots 400, 500 which are realized within the fan-out FO area of the molding compound layer 110. The coupling slot 500 is herein referred to as first (lower) coupling slot 500 and the coupling slot 400 is herein referred to as second (upper) coupling slot 400. In FIG. 18, the fan-out FO area is the total upper surface area without the surface area right above the IC 120.

The term "transition area" is herein used to define/describe the area next to the lower coupling slot 500.

The term "unit cell 115" is herein used to define/describe a building block of an apparatus 100 and system 150. Typically, the apparatus 100 or system 150 comprises a number of n unit cells 115 being arranged around the IC 120 (where n is a natural number ≥1).

In at least some embodiments, the re-distribution layer stack 140 comprises at least one TEM signal path 112 or 116 which "connects" inside the transition area one of the signal ports of the IC 120 with the lower coupling slot 500.

In at least some embodiments, the re-distribution layer stack 140 comprises at least two TEM signal paths 112.1, 112.2 or 116.1, 116.2 which "connect" inside the transition area two of the signal ports of the IC 120 with the lower coupling slot 500.

In the transition area (which is in at least some embodiments circumscribed by vias 111 and ground-potential solder balls 130), the ground potential carrying conductor is either present on the $1^{st}$ redistribution layer 182 or on a $2^{nd}$ redistribution layer and connects all ground-potential carrying vias 111 and solder balls 130. Note that some of the figures (cf. FIGS. 4A, 4B, 5, 14-17) explicitly show the vias 111 (or circles defining the position of the vias 111) and solder balls 130 and that some of the other figures (FIG. 4C, 8A-13B) only show dashed lines 111.1 and 130.1 to indicate the position of the vias 111 and solder balls 130.

In at least some embodiments, all unit cells 115 are provided with a preferably centrally arranged coupling slot 500, which
- resonates with its lowest resonance mode within the operational bandwidth,
- has a fundamental resonance mode with dominant electrical field oriented parallel to the nearest borders of the IC 120),
- is accessed by signal paths 112, 112.1, 112.2, 116, 116.1, 116.2 from the transition area side oriented towards the embedded IC ports (cf. FIG. 18).

In case of a coplanar waveguide (cf. FIG. 8A, 8B, for example), the narrow slots 118 present between conducting signal paths 116 and ground lines 117.1, 117.2 connect to the periphery 506 of the resonating slot 500 (cf. FIG. 8A), i.e. the otherwise closed periphery 506 is opened locally to provide access to excitation signals traveling along the conducting signal paths (e.g. the paths 116).

In at least some embodiments, the conducting signal path or paths 112, 112.1, 112.2, 116, 116.1, 116.2 are protruding into the area of the resonating slot 500 and are either capacitively coupling to certain slot features at certain locations, or are making a galvanic contact.

In case of microstrip transmission line interconnects 116 (cf. FIGS. 10A, 10B) or 116.1, 116.2 (cf. FIGS. 4C, 11A, 11B, 12A, 12B, 13A, 13B), the closed periphery of the resonating lower slot 500 is maintained untouched. The microstrip signal paths 116, 116.1, 116.2 are also protruding into the area of the resonating slot 500, while preferably coupling capacitively to certain slot features through the dielectric isolation layer 181.

Alternatively, galvanic contact between re-distribution layers that comprise the resonating slot 500 and signal line structures, respectively, may be established by metalized vias.

Preferably, the interconnecting lengths between the IC 120 and the resonating slot 500 in the transition area of a unit cell 115 are kept as short as possible (FIG. 18 indicates that by placing the unit cells 115 right next to the respective IC borders 121.1, 121.2, the signal paths 116 can be very short. I.e. the nearest row of vias 111 to the IC 120 (in FIG. 4A the three vias 111 at the left hand side) is positioned just adjacent to the border 121.2 of the IC 120 or can even be resembled by the border 121.1 or 121.2 of the IC 120 (this is possible with negligible signal loss penalty due to the high semiconductor DK and especially with bulk silicon used for CMOS and BiCMOS/SiGe ICs 120).

The embodiment of the apparatus or system 150 shown in FIG. 4A is shown in an exploded perspective view and comprises one unit cell 115 and a waveguide arrangement. This waveguide arrangement comprises an air-filled hollow waveguide 200 and a coupling aperture 210. The IC 120 (not shown in FIG. 4A) is assumed to reside adjacent to the unit cell 115 on the left hand side (−y axis direction) in FIG. 4A. It is also electrically connected to the signal conductors 112. With this relative positioning of IC 120 and the $n^{th}$ unit cell 115, the next unit cell (n+1) is directly adjacent in direction of the positive x axis, while the previous $(n-1)^{th}$ unit cell is directly adjacent in direction of the negative x axis. The hollow waveguide 200 has a height h1, and a width w1. The width w1 of the waveguide is always chosen to be smaller than the height h1. This results in a fundamental waveguide mode (TE10), with the first index related to the z axis (the electrical field varies in a sinewave fashion along the z coordinate), and the second index is related to the x direction. Its value (=0) means, that there is a constant electrical field strength between the two broad waveguide walls (no field variation). As a consequence, the dimension h1 cannot be reduced below a certain value, if wave propagation is desired inside the hollow waveguide. The relation $h1 \gg c_0/(2*fop)$ must hold for any frequency in the operation bandwidth. The right-hand side of this relation refers to the cut-off frequency fc of the waveguide, which is usually chosen to be below 80% of the lowest frequency of operation. Since a much smaller pitch (distance between waveguide centerplanes) than h1 is desired, the waveguide 200 is oriented in the way shown in FIG. 4A. This is done, because the w1 dimension is the direction, in which the TE10 mode does not show field special variation. The only effect from continuously reducing w1 is a proportional lowering of the characteristic wave impedance, while the cut-off frequency only depends on the h1 dimension. Hence, the waveguide 200 can be made flatter and flatter (smaller w1) in order to reduce the unit cell pitch. With this orientation of the waveguide 200, its fundamental TE10 mode has H-field vectors (field lines) parallel to the y/z plane of FIG. 4A. The magnetic field has strong z- and y-components close to the lower narrow wall and close to the short circuited and on the left hand side. Thus, it is convenient to excite this magnetic field with an aperture that has the same orientation of its dominant mode magnetic field (forming rings parallel to the y/z plane). Also, the second slot 400, which is positioned directly under the aperture 210, is oriented in in y-axis direction and has dominant Hy and Hz components. These orientations all result from the desire to minimize the waveguide arrangement pitch, and must hold throughout the unit cell 115. Therefore, also lower (first) slot 500 is oriented in the same way. Both slots achieve resonance within the frequency band of interest with this (field) orientation, despite the small width of the shielded chamber, defined by the fences of vias 111 and solder balls 130. The same cannot be achieved easily by using patch-like resonators in the place of slots 400, 500, with the same field orientation fitting the waveguide and within the small desired unit cell pitch. In summary, the resonating slots 400 and 500, the coupling aperture 210 and the waveguide 200 all share the same H-Plane of their dominant electromagnetic fields, namely the y/z-plane in the FIG. 4A, which is orthogonal to the sequence of unit cells.

It shall be noted, however, that with the selection of slot-orientations within the unit cell 115 following the above given guideline, the arrangement of waveguide 200 and/or 210 can still be rotated with respect to the unit cell 115, around the z-axis of FIG. 4A within a certain angular range, e.g. ±30°, while maintaining reasonable coupling efficiency and reasonable performance.

As a consequence of orienting the largest extension of resonant slots 400, 500 orthogonal to the unit cell sequence and along the borders 121.1, 121.2 of the IC 120, the feeding (excitation) of slot lower 500 must be accomplished while approaching it with signal paths 112 from one of its narrow ends. A number of solutions to this task is given here and described further below, related unit cell 115 constructions are shown in FIGS. 4C and 8A to 13B.

The second resonating slot 500 architecture establishes its resonance frequency in presence of both dielectric material (re-distribution stack insulation 181 and molding compound layer 110) on one side and the air volume entrapped between the first ground layer, pad or plane 180.1 on the one side and the substrate's upper metal layer (herein called third ground layer, pad or plane 190) as well as laterally by the ground-connected solder balls 130 of the apparatus 100). The use of a chip underfill material in order to increase solder joint reliability results in at least partial resemblance of this entrapped air volume with a low-DK dielectric material, which can be taken into account by slightly re-tuning the slot dimensions for maintaining the same resonance frequency.

The effective dielectric constant of this kind of architecture results typically close to the arithmetic mean of the values for the used dielectric material and air or underfill material, i.e. the effective dielectric constant is between 2 and 3.5.

The resonant frequency of the first resonating slot 500 is also influenced by the electrically conducting boundary condition provided by the array or fence of vias 111 which penetrate the molding compound layer 110. The array comprising the vias 111 or the through-mode via fences establish a vertical duct inside the molding compound material for electromagnetic waves, which takes the shape of a preferably rectangular waveguide (the dashed lines 111.1 in the respective FIGS. 4C, 8A, 9A, 10A, 11A, 12A, 13A show rectangles), which is filled by the dielectric molding compound material. Therefore, the mutual distance between narrow "walls" or "fence segments" of this waveguide is chosen to ensure fop≫fc, the cut-off frequency of its fundamental TE10 mode (the TE10 mode is the dominant mode in this waveguide duct).

The dielectric constant of molding compound materials range between ca. 3 and 4.5, a typical value being close to quartz glass ($\varepsilon R=3.8$). A suitable cut-off frequency for automotive radar and communication in the E-Band may be 50 to 55 GHz. Therefore, effective inside dimensions of these dielectrically filled vertical signal waveguide ducts range from 1.35 mm to 1.55 mm in radial direction of the eWLB package of the apparatus 100. Therefore, the choice to commute the microwave energy through the molding compound material allows to use a fully shielded signal path, while keeping the occupied area projected onto the ground planes much smaller than the cross-section of a hollow (rectangular) air-filled waveguide.

A second resonating aperture (referred to as upper coupling slot 400) is provided in a metal layer placed on top of the unit cell 115, preferably having its axis centered with the axis of the first resonating slot 500. In at least some embodiments, the orientation of the upper coupling slot 400 is also aligned with the first resonating slot 500, e.g. to provide aligned E-planes. However, its relative orientation may be rotated within limits, e.g. $-30°<\phi<+30°$, effecting a rotation of the E-field polarization, or allowing the attachment of an external waveguide 200 which extends into the half space above the first (upper) surface 110.1 so as to guide the electromagnetic wave into a desired direction.

The external waveguides 200 can in all embodiments be attached to or mounted on top of the molding compound layer 110 so as to provide a propagation direction for the electromagnetic wave parallel to the positive or negative y-axis or to the positive z-axis, for example.

As already mentioned, the external waveguides 200 of all embodiments may comprise an enlarged waveguide portion or segment 213. Inside this enlarged waveguide portion or segment 213 there is a dominating electromagnetic wave, the H-plane of which is parallel to the y/z plane in case of the embodiment of FIG. 4A.

The propagation direction of the dominating electromagnetic wave inside the enlarged waveguide portion or segment 213 is shown by means of a dashed path designated with a P and has a curved path, gradually changing its direction in the y/z plane with propagation.

Figure 6:
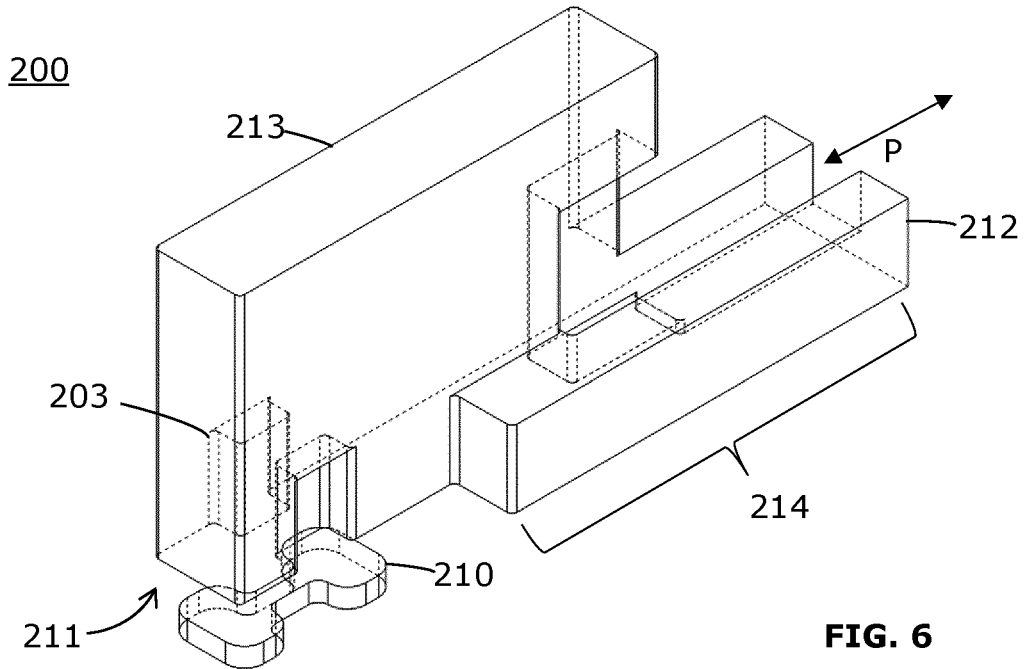
FIG. 6 shows a perspective view of another waveguide which can be used in connection with the embodiment of FIG. 4A, for example.
Figure 7:
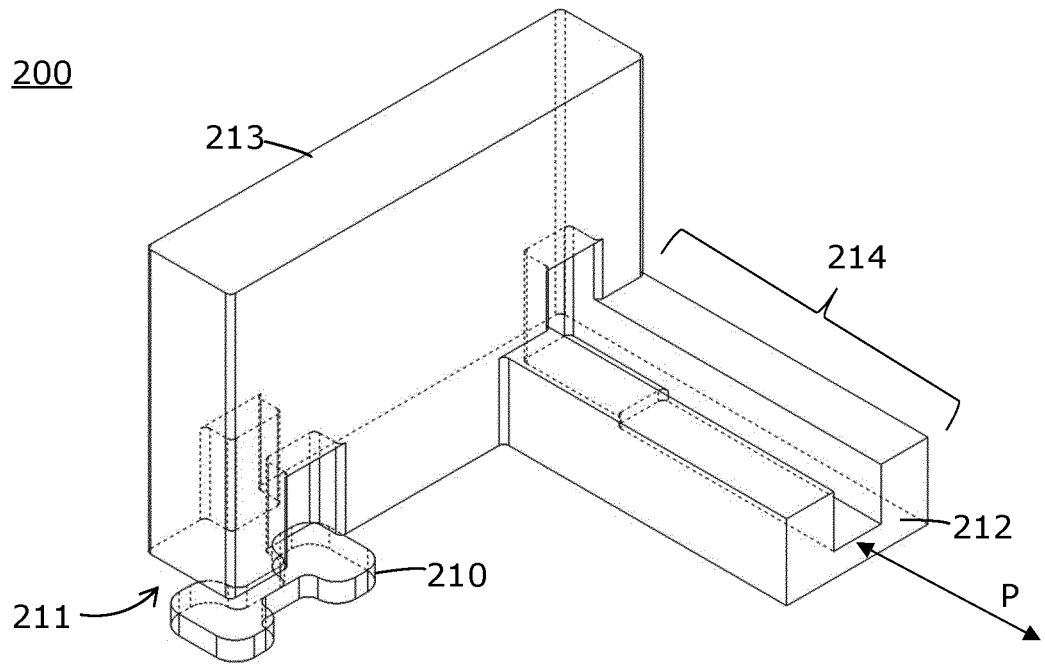
FIG. 7 shows a perspective view of yet another waveguide which can be used in connection with the embodiment of FIG. 4A, for example.

If the waveguide 200 comprises a ridge-waveguide portion or segment 214 (cf. FIGS. 6, 7 and 19, for example), then the orientation of the H-plane changes, when the dominating electromagnetic wave enters this ridge-waveguide portion or segment 214 (referred to as in-line and 90° twists). The embodiment of FIG. 6 provides for a 90° H-plane twist, while wave propagation continues parallel to y axis and the embodiment of FIG. 7 provides for an E-plane twist (its dominant E-field component turns from Ex polarization to Ez polarization, and the direction changes by 90° parallel to the x/y plane.

In at least some embodiments, the external waveguides 200 are attached to or mounted on top of the molding compound layer 110 by means of a glue (e.g. an anisotropic conductive adhesive (ACA) glue, as used in semiconductor fabrication processes for (conductive) adhesive bonding purposes). In any case, the attachment or mounting should be carried out so that the second ground layer, pad or plane 180.2 and the metallization of the external waveguides 200 are both on RF ground potential.

The second resonating aperture, i.e. the upper coupling slot 400, is circumscribed by the same through-mold via fence as the lower coupling slot 500, and therefore is affected in a similar way by the dielectric material underneath and by the air above the apparatus 100.

In at least some embodiments, the upper coupling slot 400 is being circumscribed by an H-shaped opening in a (lower) wall of the attached hollow waveguide 200, with a certain lateral space between its periphery line and the inner conducting walls of the waveguide opening (in order to allow for certain mechanical mounting tolerances when attaching the external waveguide 200 to the upper portion of the molding compound layer 110). There is a galvanic or low-impedance RF contact between the top metal layer 180.2 and the lower portion of the surface hollow waveguide 200. The resonance frequency of the upper coupling slot 400 present on top of the molding compound layer 110 is therefore influenced also by the shape and size of the opening (aperture 210), i.e. can be modified or tuned to some extent by a microwave component that is being attached to the system 150.

The vertical signal or waveguide duct provided through the molding compound of the molding compound layer 110 by merit of the via fence is preferably not used as an impedance transformer element, but provides for a certain coupling between the two coupling slots 400, 500. By appropriate tailoring of the shapes and sizes of the slots 400, 500, different thicknesses d1 of the molding compound layer 110 can be readily adopted (e.g. 0.2 mm to 0.6 mm package thicknesses can be accommodated in this way).

In at least some embodiments, one of the lower layers of the re-distribution layer stack 140 comprises a first ground layer, pad or plane (herein first ground plane 180.1), as shown in FIG. 4B, for example. In accordance with the present specification, the first ground plane 180.1 is provided with at least one coupling slot 500 (details will be addressed later).

In at least some embodiments, the apparatus 100 comprises a second ground layer, pad or plane (herein second ground plane 180.2) being situated on or in one of the uppermost layers of the apparatus 100 as shown in FIG. 4B, for example. The second ground plane 180.2 is provided with at least one coupling slot 400, too (details will be addressed later).

In at least some embodiments, the upper coupling slot 400 is arranged on top of the other 500 coupling slot and the molding compound is situated between these two slots 400, 500. I.e., the two coupling slots 400, 500 are provided in a stacked arrangement on the upper side and lower side of the molding compound layer 110.

The lower slot 500, when being excited by an electromagnetic wave received through a signal path (e.g. the paths 112, 112.1, 112.2, 116, 116.1, 116.2), radiates the electromagnetic wave through the material of the molding compound layer 110 towards the upper slot 400.

In at least some embodiments, the coupling slots 400, 500 may have different shapes and/or sizes, but they should have the same or nearly the same resonance frequency. When designing these slots 400, 500, one has to take into account that both slots 400, 500 are designed to couple with each other and that the upper slot 400 resonates in a waveguide aperture 210 (cf. FIG. 4A, 6, 7) and the lower slot 500 resonates in conjunction with a solder ball-delimited back-short cavity, as will be addressed later.

In at least some embodiments, the waveguide aperture 210 has the shape similar to the capital letter "H" (cf. FIG. 4A), thereby providing a reduced size while keeping the TE10 cut-off frequency below the operational frequency range. This aperture 210 can be employed to couple to a segment of a rectangular waveguide 200. It can be realized e.g. by a metalized portion of a plastic piece part or by laser-cutting, etching or punching a metal sheet.

In an apparatus 100 comprising a first ground plane 180.1 with at least one coupling slot 500 and a second ground plane 180.2 with at least one coupling slot 400, these two coupling slots 400, 500 are provided in a superimposed arrangement where in the top view (cf. FIG. 4C, 8A, 9A, 10A, 11A, 12A, 13A, 14-17) one slot 400 is situated exactly above the other slot 500 so that both slots 400, 500 are able to resonate and effectively exchange energy at frequencies within the operational bandwidth of the apparatus 100.

In at least some embodiments, the two superimposed slots 400, 500 preferably share the same vertical symmetry planes. In case of the embodiments of FIGS. 4A-4D, and 8A-17, the respective vertical symmetry plane is a plane parallel to the y-z-plane.

In at least some embodiments, the two ground planes 180.1 and 180.2 are mutually connected by a conductive via fence (e.g. formed by a plurality of through vias 111 arranged in one or two rows) circumscribing both coupling slots 400, 500 and defining a cross section parallel to the ground plane 180.1 and 180.2, which permits a fundamental (TE10) mode wave propagation in vertical direction (parallel to the z-axis) only, within the operational bandwidth.

The resonating slot 500 in the first ground plane 180.1 is being excited by a planar (TEM) transmission line arrangement (e.g. by the paths 112, 112.1, 112.2, 116, 116.1, 116.2) in the same layer of the re-distribution layer stack 140, or in another layer of the re-distribution layer stack 140. If the respective transmission line arrangement is part of another layer of the re-distribution layer stack 140, then it is preferred to use a closely adjacent signal re-distribution metal layer of the apparatus 100 as the conductor carrying the slot 500.

In at least some embodiments, both a balanced and a single-ended stripline can be arranged to cross the slot 500 close to its center portion, the latter being terminated in a short (<lambda/4) open ended stub. Likewise, a balanced transmission line can be routed along the longer extension of the slot 500, partially overlapping it and being centered with the same plane of symmetry—short, equal lengths of open-circuit terminated lines are stretching out to either side of the slot 500.

A preferred shape of the resonant slot 500 in the first ground plane 180.1 is two-fold mirror symmetrical and is provided with a T-junction at either end of a stretched central portion 501 of the slot 500 (cf. FIG. 8A, 8B). Attached to each of the four outward-pointing T arms 502 is a bent or angled slot stub 504 (also called fold-back appendix) being folded back towards the central region. The resulting shape features two opposing T-shaped peninsulas of ground conductor, opposing each other. At any of the two narrow ends of the slot arrangement, open-ended microstrip lines (cf. FIGS. 10, 11, 12 for example) may be arranged on a separate conductor layer of the re-distribution layer stack 140, at least partially overlapping the peninsula-shaped ground connector in order to excite the resonant slot fields. The excitation is either provided by a pair of microstrip open stubs 112.3 (cf. FIG. 4C) or 116.4 (cf. FIG. 13A), each partially overlapping one of the opposite ground conductor peninsulas; or it can be provided by a single open stub (cf. FIG. 10), just overlapping the left- or right-situated peninsula, providing a choice of 0° or 180° electrical excitation phase. Such a resonant slot 500, as described in this paragraph, can be used in connection with all embodiments.

In at least some embodiments, the apparatus 100 comprises a carrier or substrate 170 (herein called substrate 170). Embodiments of the substrate 170 may include substrates of different type and configuration, in particular PCBs (Printed Circuit Boards), SBU (Sequential Build-Up) laminate substrates, ceramic substrates, lead frames and mold compounds, e.g., MIDs (Molded Interconnect Devices).

In at least some embodiments, the substrate 170 carries a ground layer, pad or plane 190 (herein third ground plane 190, as shown in FIG. 4A, for example) on a first (upper) surface 170.1 and this third ground plane 19 is connected to the first ground plane 180.1 by those solder balls 130 which are shown in FIGS. 4A, 4B, 5, 14-17, and 19. The solder balls 130 of these Figures form or define the ball-delimited backshort cavity, which was mentioned before.

In at least some embodiments, preferably the first and third ground planes 180.1, 190 are mutually connected by BGA solder balls 130, circumscribing the resonant coupling slot 500 present in the first ground plane 180.1. In order to allow the unobstructed placement of this coupling slot 500 in the first ground plane 180.1, two or more solder balls 130 may have to be omitted (cf. FIGS. 14-16). Note that a conventional solder ball grid in the example of FIG. 4A would comprise two more solder balls 130 in the middle. Instead of 12 solder balls 130, the present embodiment comprises 10 solder balls 130 only. Due to the fact that some of the solder balls 130 in the middle are omitted, the remaining balls 130 form some kind of a "fence" around the area where the lower resonant coupling slot 500 is situated. This area is referred to as ball-delimited backshort cavity. It is to be noted that embodiments are possible where none of the solder balls 130 have to be omitted (cf. FIG. 17). In this case, the pitch of the BGA is large enough, and the height of the air or underfill material volume entrapped between the solder balls 130 sufficiently large (e.g. with a package pitch of 0.65 mm), that there is enough room for placing a resonant slot 500 in between, without removing a single ball 130.

FIGS. 4A, and 14-16 show embodiments where single rows of solder balls 130 are arranged around the lower slot 500. In a top view, these single rows of solder balls 130 define a rectangular shape, for example.

In at least some embodiments, single rows of solder balls 130 are employed (as for example shown in FIGS. 4A, and 14-16) in order to circumscribe the lower resonant coupling slot 500.

In at least some embodiments, two parallel rows of solder balls 130 are employed in order to fully circumscribe the lower resonant coupling slot 500. An embodiment with two parallel rows of solder balls 130 provides a better electromagnetic "isolation" of adjacent channels.

In at least some embodiments, the ground plane 190 present on the substrate 170 is essentially contiguous (at least in the transition area of a unit cell 115 where the slot 500 is realized) and serves as a shielding device, in conjunction with the surrounding solder balls 130.

In least some embodiments, the ground plane 190 present on the substrate 170 is essentially contiguous across several unit cells 115. In other words, several unit cells 115 share a common ground plane 190.

Optionally, the ground plane 190 features small apertures or planar probes for functional testing purposes, with test points accessible from the side of the substrate 170.

In at least some embodiments, the re-distribution layer stack 140 comprises one or more than one metallization layer, which is/are patterned so as to realize conducting paths (e.g. the paths 112, 116), and at least one insulating layer carrying this metallization layer. In at least some embodiments, the re-distribution layer stack 140 further comprises the already mentioned first ground plane 180.1 (metallization).

In the following paragraphs, further details of the first embodiment of FIG. 4A-4D are addressed.

FIG. 4A shows an exploded, perspective view of a first embodiment of an apparatus 100 and FIG. 4B shows a side view of this embodiment where all elements and layers are put in place.

The apparatus 100 comprises a molding compound layer 110 which has opposing first and second surfaces 110.1, 110.2. These surfaces are herein also referred to as upper surface 110.1 and lower surface 110.2.

The apparatus 100 further comprises an integrated circuit device 120 (cf. FIGS. 18A, 18B, 19). This IC 120 is at least partially surrounded by the molding compound layer 110 so as to define a fan-out area FO located laterally outside of the outline of the IC 120. FIGS. 4A, 4B show a small portion of this fan-out area FO.

The molding compound layer 110 comprises a plurality of vias 111 within the fan-out area FO. These vias 111 extend through the molding compound layer 110 between the first and second surfaces 110.1, 110.2 and are arranged so as to form a via closed fence.

The molding compound layer 110 is designed so as to serve as dielectric filled waveguide section or duct confined by a fence formed by the plurality of through-mode vias 111. This dielectric filled waveguide section couples the lower slot 500 and the upper slot 400 of the apparatus 100.

The apparatus 100 further comprises a re-distribution layer stack 140 (not shown in FIG. 4A). This re-distribution layer stack 140 is typically realized on the lower surface 110.2 and it extends parallel to this lower surface 110.2. It comprises conducting paths 112, 116, for example. FIG. 4A shows an isolated conducting path 112 which is designed as slot-exciting quasi TEM line for a balanced chip port of the IC 120.

The apparatus 100 further comprises a substrate 170 which has a first (substrate) surface 170.1 extending parallel to the molding compound layer's 110 lower surface 110.2. This substrate 170 carries a grid array of solder balls 130.

The apparatus 100 further comprises two coupling slots 400, 500 being arranged on two different levels of the apparatus 100 so as to resonantly couple with each other. In accordance with the embodiment of FIG. 4A, the coupling slot 400 is defined in the upper surface 110.1 and the coupling slot 500 is defined in lower surface 110.2.

There is at least one hollow, air-filled waveguide 200 with an open coupling aperture 210 at one end. This waveguide 200 is arranged with its E-plane parallel to one of the edges 110.l, 110.t of the apparatus 100 and the open aperture 210 is arranged adjacent to or above the coupling slot 400. In FIG. 4A the waveguide 200 and the aperture 210 are shown as "airboxes" only (an airbox just shows those portions of the waveguide which are filled with air). All surfaces of this box are assumed covered with a good electrical conductor, with the exception of its (two) external wave ports 211, 212. An electromagnetic wave in this constellation travels parallel to the positive y-axis and may exit the waveguide 200 to the right (through the waveguide port 212).

FIG. 4B shows a side view, as mentioned before. The waveguide 200 comprises small internal ridges 203 which are designed to provide for a waveguide-side matching. These internal ridges 203 are designed so as to guide an electromagnetic wave which is received via the waveguide port 212 into the lower left-hand corner of the waveguide 200 where the wave is coupled through the aperture 210 at the port 211 into the slot 400. The ridges concentrate the electrical field and compress the overall electromagnetic field distribution accordingly in their vicinity. This means, that also the magnetic field strength in the lower left-hand corner, close to the aperture 210, is increased, enhancing the coupling strength. If this constellation is used in the reverse direction, then an electromagnetic wave, which is received via the aperture 210 at the port 211, is guided by the internal ridges 203 out of the lower left-hand corner into the waveguide 200 and through the port 212 out of this waveguide 200.

FIG. 4C shows a transparent top view of the molding compound layer 110 of the embodiment of FIG. 4A. The upper slot 400 in this example has a club or barbell shape and the lower slot 500 in this example comprises two square end segments 503 and a thin connecting stretched central portion 501.

Underneath of this molding compound layer 110, there are two symmetric conducting paths 112 which are designed so as to excite the lower slot 500. The width of the two (end) strips 112.3 of the conducting paths 112 and the width of the slot 114 between these two strips 112.3 define the transmission line characteristic impedance.

The plurality of vias 111, which extend through the molding compound layer 110 between the first and second surfaces 110.1, 110.2, are arranged so as to confine the dielectric filled waveguide section. In the top view of FIG. 4C, one can see that the vias 111 are arranged in single rows along the edges of a rectangle which surrounds the slots 400, 500. The lines defining the positions of these vias 111 are shown in FIG. 4C as dashed lines.

In at least some embodiments, single rows of vias 111 (as shown in FIG. 4C, for example) are employed to confine the dielectric filled waveguide section.

In at least some embodiments, two parallel rows of vias 111 are employed to confine the dielectric filled waveguide section.

Figure 4D:
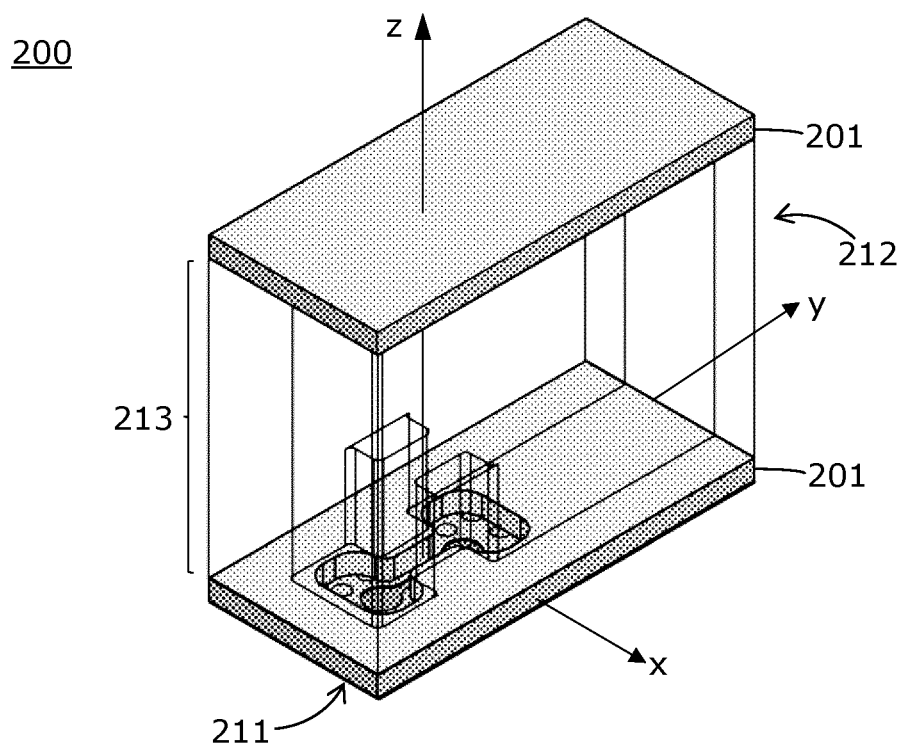
FIG. 4D shows a perspective view of a waveguide which can be used in connection with the embodiment of FIG. 4A, for example.

FIG. 4D shows a perspective view of a waveguide 200 which can be used in connection with the embodiment of FIG. 4A, for example. This waveguide 200 comprises an upper metal layer 201 and a lower metal layer 202. These metal layers 201, 202 can be realized by means of thin metal sheets, for example. In between these metal layers 201, 202, there is an injection molded waveguide portion 200. The open aperture 210 is realized (e.g. by laser cutting or etching) in the lower metal layer 202. The walls/surfaces of the injection molded waveguide portion 200 are metallized.

Figure 5:
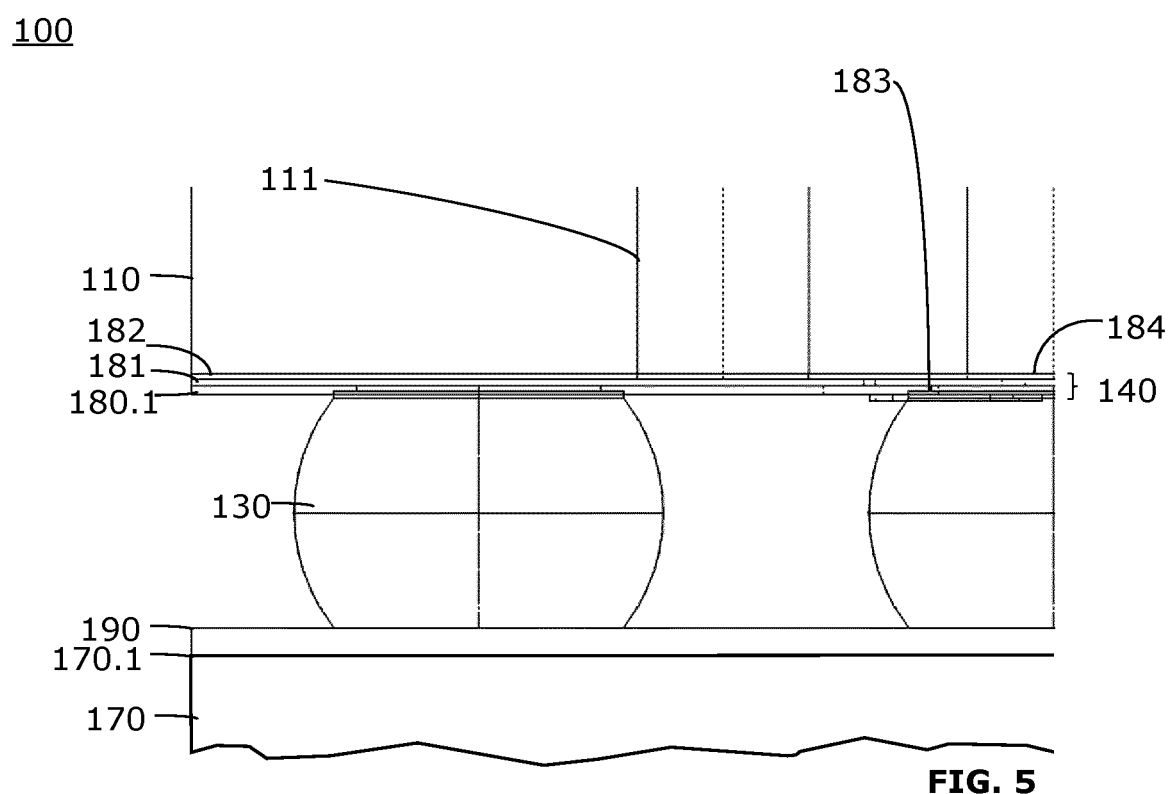
FIG. 5 shows a transparent side view of the lower portion of another embodiment.

FIG. 5 shows a transparent side view of the lower portion of another embodiment of an apparatus 100. The apparatus 100 of this embodiment comprises (from the bottom up) a substrate 170 with a third ground layer 190 on top of its upper surface 170.1, a plurality of solder balls 130, a re-distribution layer stack 140, and a molding compound layer 110 with integrated/integrally formed vias 111. In the present embodiment, the re-distribution layer stack 140 comprises (from the bottom up) the first ground layer 180.1 (e.g. realized inside or a part of a 1$^{st}$ redistribution layer), a thin dielectric layer 181 (e.g. a Benzocyclobutene (BCB) dry film layer), and a 1$^{st}$ redistribution layer 182.

The first ground layer 180.1 and the dielectric layer 181 of all embodiments may comprise metal pads 183 serving as under ball metallizations for the solder balls 130.

FIG. 6 shows a perspective view of the airbox of another air-filled waveguide 200. This waveguide 200 can be used instead of the waveguide 200 of FIG. 4A, for example. The waveguide 200 of FIG. 6 has a straight ridge waveguide output port 212 being oriented parallel to the y-axis (i.e. parallel to the longitudinal edges of the apparatus 100). This waveguide 200 is designed so as to provide for an in-line E-plane twist function along the y-axis. It shall be noted, that signals emitted by the IC 120 are forming waves emanating from aperture 210 along the short ridges 203, i.e. in z-axis direction, and immediately turn over into y-axis direction. Thus, a very compact and efficient 90° H-plane bend is directly implemented. The height (along z-axis) of the waveguide 200 in this area is chosen large enough, to allow for wave propagation along the y-axis (i.e. the cut-off frequency of TE10 waves travelling along the y-axis is well below the operational band.

FIG. 7 shows a perspective view of the airbox of another air-filled waveguide 200. This waveguide 200 can be used instead of the waveguide 200 of FIG. 4A, for example. The waveguide 200 simultaneously forms an E-plane twist and 90° direction change. The waveguide 200 of FIG. 7 has a bent ridge waveguide output port 212. This waveguide output port 212 is oriented parallel to the x-axis (i.e. parallel to the transversal edges of the apparatus 100). It shall be noted, that the orientation of the ridge waveguide output port 212 can be readily changed to point into -x direction. This just involves a mirror operation respective y/z-plane. The ridged waveguide portion of the waveguide 200 can also be flipped vertically, as to emanate from the upper narrow wall of the y-axis oriented portion of the rectangular intermediate waveguide. Thus, 4 individual "isomeric" versions exist without any redesign or specific tuning of the arrangement.

Similarly, the arrangement of FIG. 6 can be changed to provide a ridged waveguide output attached to the same, lower narrow side wall of the intermediate waveguide, but offset to the other side. Again, both of these arrangements can be flipped over vertically, to provide ridged waveguide output ports 212 attached near the upper narrow waveguide wall.

FIG. 8A shows a top view of an embodiment of a unit cell 115 with a G-S-G (ground-signal-ground) configuration. FIG. 8B shows a respective exploded perspective view. Such a configuration can be used to provide for an efficient transition between a "single-ended" port of the IC 120 and the lower slot 500. There is a via fence comprising single rows of vias 111 situated around the slot 500. The via fence of this embodiment comprises 14 vias 111. Their mutual distance is chosen to leave gaps of less than a quarter wavelength in the mold material, in between each other. The upper slot 400 has about the same shape as the upper slot 400 in FIG. 4C and the lower slot 500 is two-fold mirror symmetrical and is provided with a T-junction 502 at either end of a stretched central portion 501 of the slot 500. Attached to each of the four outward-pointing T arms forming the slot 500 is a bent or angled slot stub being folded back towards the slot's central region. Thus, the resonant slot 500 can be accommodated quite easily inside the limited space. By adjusting the relative lengths of angled slot stubs 504 and central stretched slot portion 501, respectively, the coupling strength or coupling factor to the other slot 400 can be adjusted.

The G-S-G configuration of FIG. 8A, 8B comprises a thin central signal conductor 116 situated between two outer shielding stripes 117.1, 117.2 which are connected to ground. A phase inversion is possible by contacting the opposite side of the slot 500. The thin signal conductor 116 extends into the slot area and continues along the central, stretched portion of slot 500. The quasi-TEM wave carrying the microwave power is using the slot edges as ground conductor. Preferably beyond the x-z symmetry plane, the central signal conductor 116 is either connected to the slot edge on the right or on the left respective propagation direction. This choice is accompanied by the mentioned phase reversal. In other words, a primitive BALUN (conversion between a balanced and unbalanced, i.e. single-ended field configuration) is achieved in this local 3-conductor arrangement. Both modes coexist in the central slot region, while the mode having an E-field across both slots formed on left and right of the central conductor is emanating from the lateral contact point (visible on the right in FIG. 8) and excites the fundamental TE10 mode in the vertical, dielectrically filled waveguide duct delimited by the vias 111 forming a fence. The energy flow is just as a guided quasi-TEM-wave from left to right, coupling into the slot mode, which gradually leaks off energy into the vertical direction towards the upper slot 400.

Figure 9A:
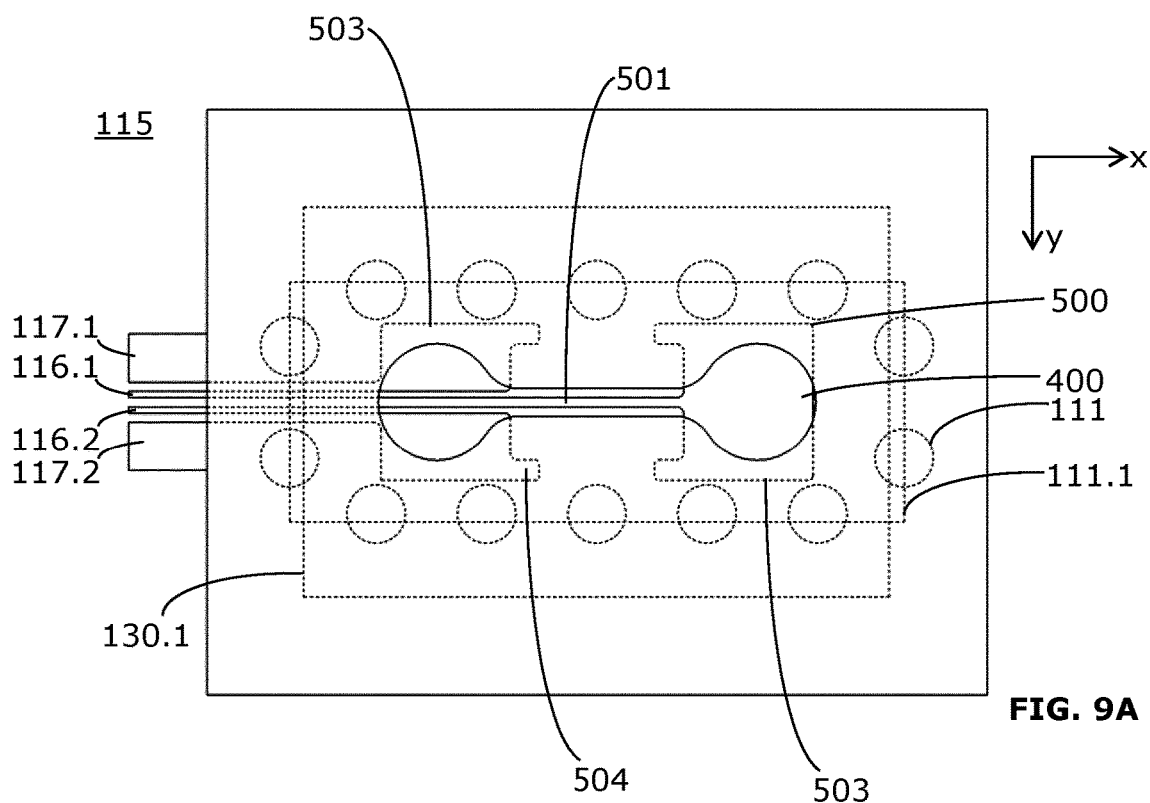
FIG. 9A shows a schematic top view of another embodiment of a unit cell.
Figure 9B:
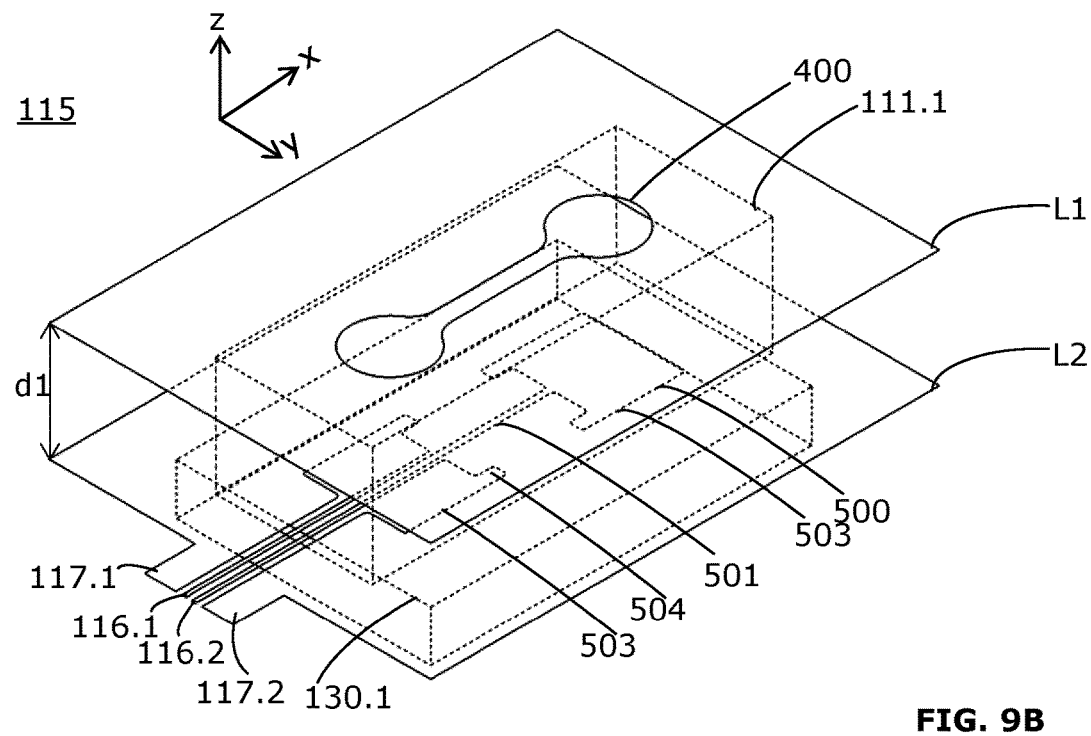
FIG. 9B shows a schematic perspective view of the embodiment of FIG. 9A.

FIG. 9A shows an embodiment of a unit cell 115 with a ground-signal(+)-signal(-)-ground (GSSG) balanced configuration. FIG. 9B shows a respective exploded perspective view. Such a configuration can be used to provide for an efficient transition between the balanced ports of the IC 120 and the lower slot 500. There is a via fence comprising single rows of vias 111 situated around the slot 500. The via fence of this embodiment comprises 14 vias 111. The upper slot 400 has about the same shape as the upper slot 400 in FIG. 4C and the lower slot 500 is two-fold mirror symmetrical and is provided with two rectangular or square end portions 503 separated by a stretched central portion 501. Each of the end portions may comprise, as depicted in FIG. 9, two short stubs or arms 504 (in FIG. 9 only one stub or arm carries a reference number).

The GSSG balanced configuration of FIG. 9A, 9B comprises two thin central signal conductors 116.1, 116.2 situated between two outer shielding stripes 117.1, 117.2 which both are connected to ground. These signal conductors 116.1, 116.2 protrude into the slot area and are simply each connected to one of the two resulting conductor islands situated between the end portions 503. The small indents or stubs 504 allow for fine adjustment of resonance frequency and coupling to the upper sot 400.

Figure 10A:
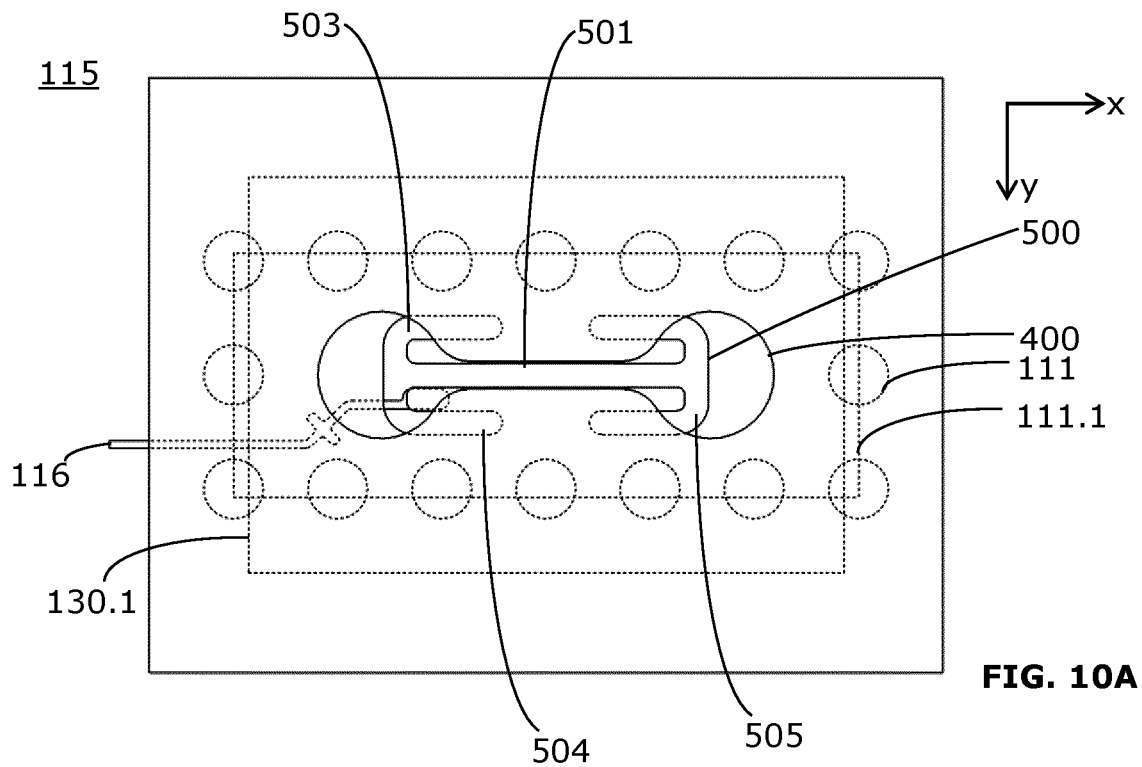
FIG. 10A shows a schematic top view of another embodiment of a unit cell.
Figure 10B:
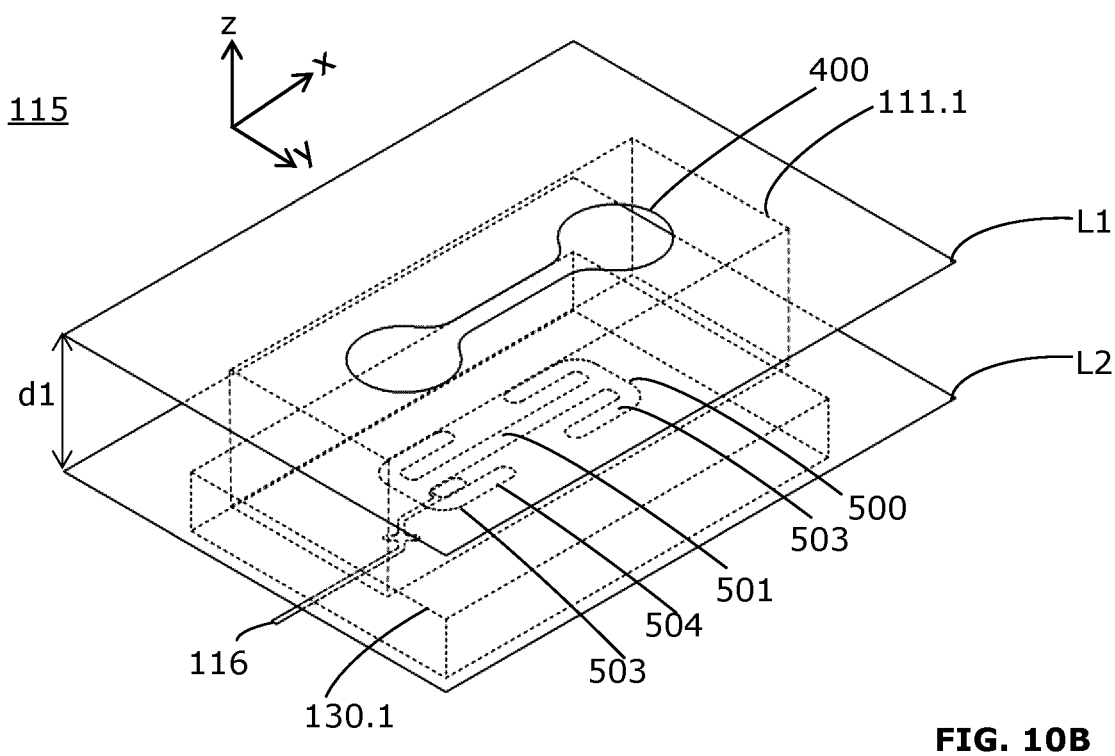
FIG. 10B shows a schematic perspective view of the embodiment of FIG. 10A.

FIG. 10A shows a top view of an embodiment of a unit cell 115 with a single-ended microstrip configuration. FIG. 10B shows a respective exploded perspective view. Such a configuration can be used to provide for an efficient transition between a single-ended port of the IC 120 and the lower slot 500. There is a via fence comprising single rows of vias 111 situated around the slot 500. The via fence of this embodiment comprises 16 vias 111. The upper slot 400 has about the same shape as the upper slot 400 in FIG. 4C and the lower slot 500 is two-fold mirror symmetrical and is provided with two T-shaped end portions 505 separated by a stretched central portion 501. Each of the T-shaped end portions 505 may comprise, as depicted in FIG. 10A, 10B, two short stubs or arms 504 (in FIG. 10A only one stub or arm carries a reference number).

The single-ended microstrip configuration of FIG. 10A, 10B comprises one signal conductor 116 offset with respect to the slot 500. This signal conductor 116 is designed so as to provide for a capacitive coupling (by overlapping and locally forming a capacitance through the thin dielectric layer 181) to a "peninsula"-like lateral extension of central conductor bulges of the slot 500. A phase inversion is possible by flipping the signal conductor 116 over to the opposite slot side.

Figure 11A:
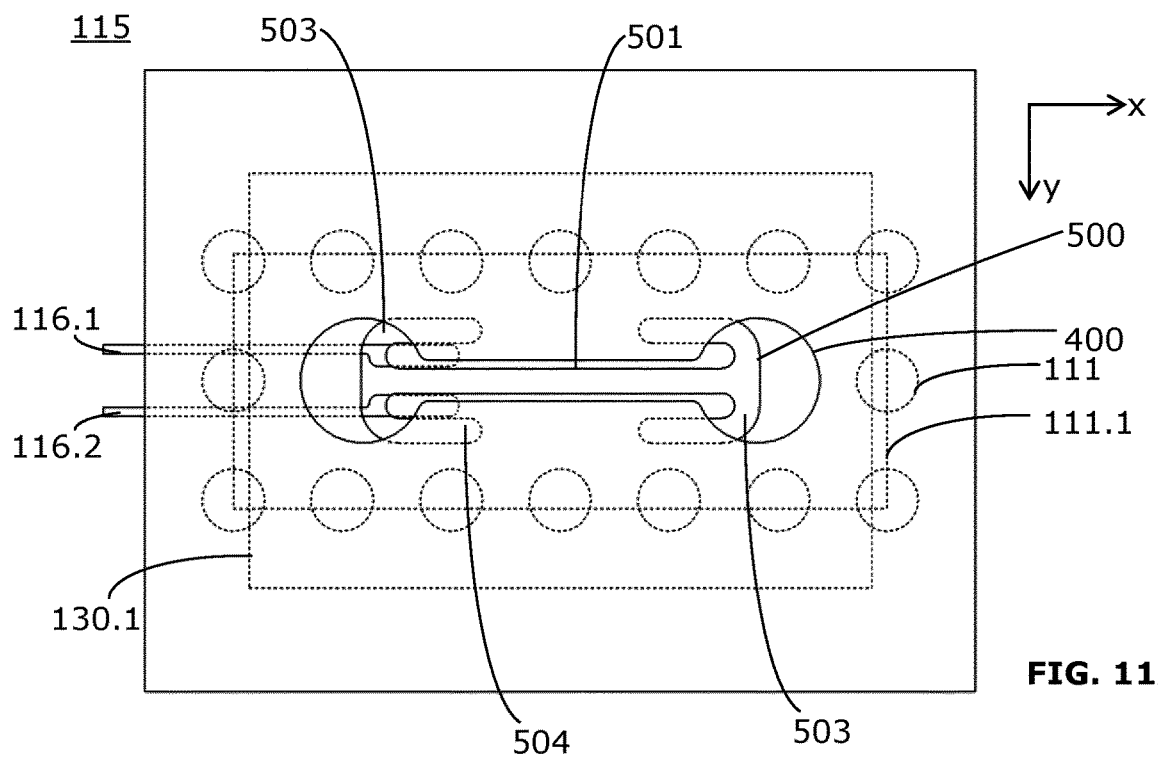
FIG. 11A shows a schematic top view of another embodiment of a unit cell.
Figure 11B:
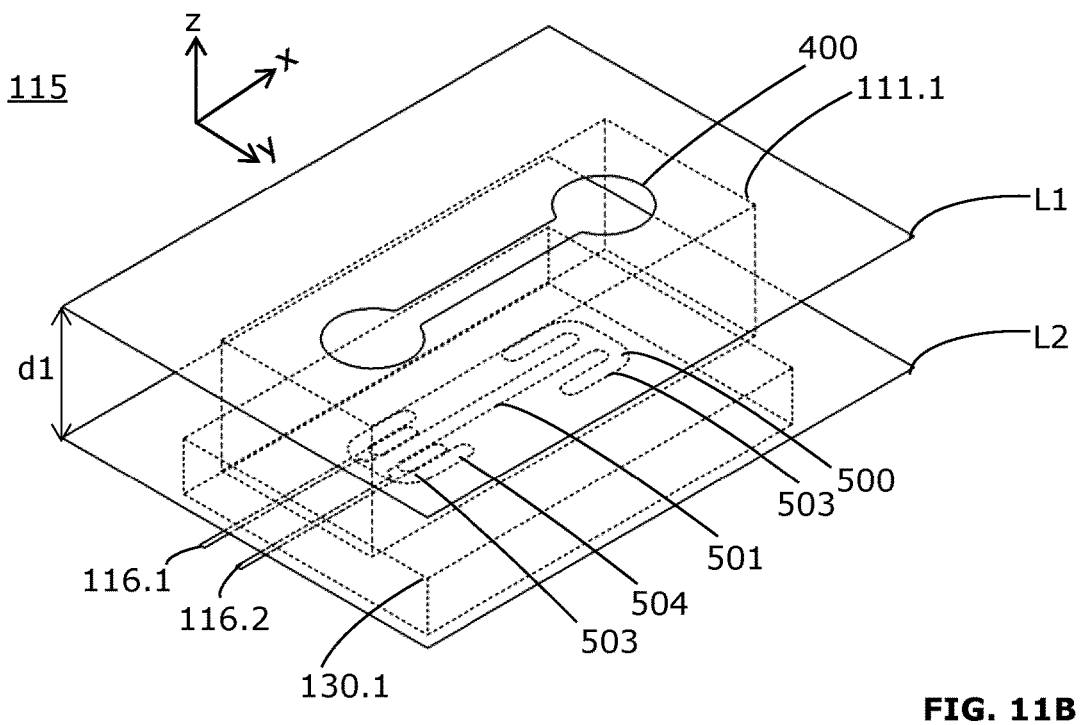
FIG. 11B shows a schematic perspective view of the embodiment of FIG. 11A.

FIG. 11A shows a top view of an embodiment of a unit cell 115 with a balanced microstrip configuration. FIG. 11B shows a respective exploded perspective view. Such a configuration can be used to provide for an efficient transition between the balanced microstrip ports of the IC 120 and the lower slot 500. There is a via fence comprising single rows of vias 111 situated around the slot 500. The via fence of this embodiment comprises 16 vias 111. The upper slot 400 has about the same shape as the upper slot 400 in FIG. 4C and the lower slot 500 has about the same shape as the upper slot 400 in FIG. 10.

The balanced microstrip configuration of FIG. 11A, 11B comprises two thin central signal conductors 116.1, 116.2. Each of these two signal conductors 116.1, 116.2 comprises an end portion situated within one of the T-shaped end portions 505. This configuration provides for a push-pull capacitive coupling in the transition area 115.

Figure 12A:
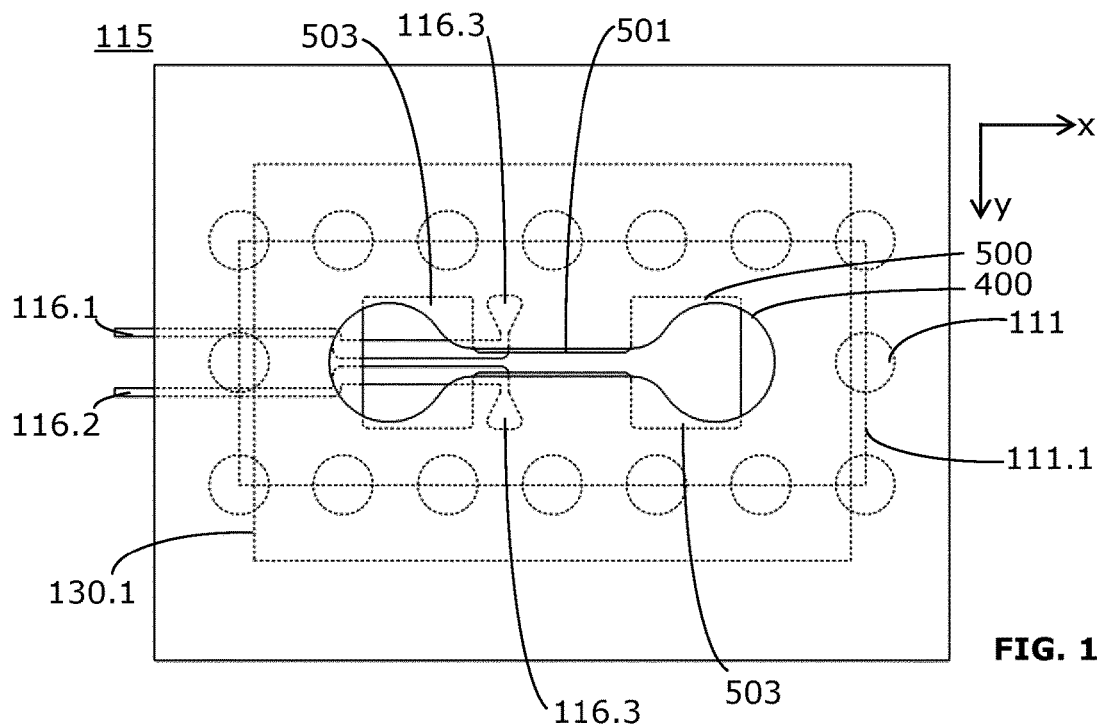
FIG. 12A shows a schematic top view of another embodiment of a unit cell.
Figure 12B:
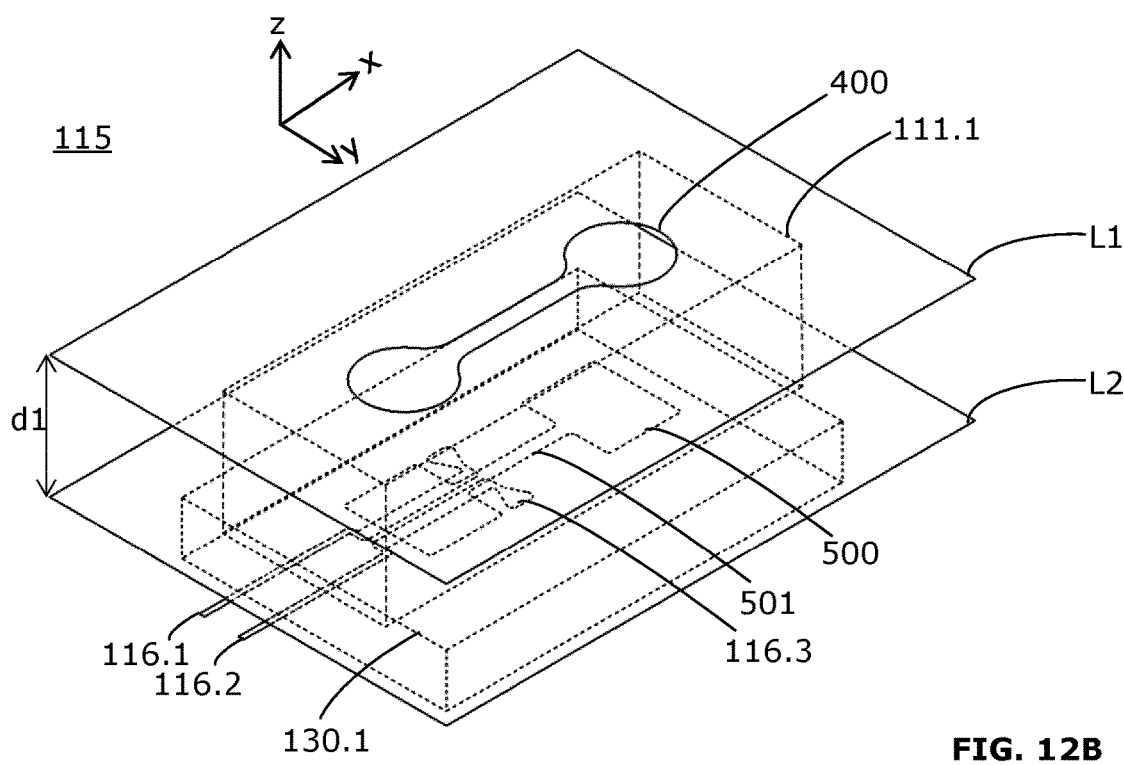
FIG. 12B shows a schematic perspective view of the embodiment of FIG. 12A.

FIG. 12A shows a top view of an embodiment of a unit cell 115 with another balanced microstrip configuration, and FIG. 12B shows a schematic perspective view of the unit cell 115 of FIG. 12A. Such a configuration can be used to provide for an efficient transition between the balanced microstrip ports of the IC 120 and the lower slot 500. There is a via fence comprising single rows of through-mode vias 111 situated around the slot 500 (the lines 111.1 define the position of the vias 111). The via fence of this embodiment comprises 16 through-mode vias 111. The upper slot 400 has about the same shape as the upper slot 400 in FIG. 4C and the lower slot 500 has about the same shape as the upper slot 400 in FIG. 4C.

The balanced microstrip configuration of FIG. 12A, 12B comprises two thin central signal conductors 116.1, 116.2. Each of these two signal conductors 116.1, 116.2 comprises an end stub 116.3 situated to the left and right of the stretched central portion 501 of the slot 500. These end stub 116.3 serve as open microstrip stubs. This configuration provides for a push-pull capacitive coupling in the respective transition area. An advantage of this arrangement is, that the position of the end stubs 116.3 can be shifted along the central slot extension (i.e., parallel to the x-axis), in order to optimize the impedance matching and operative bandwidth.

Figure 13A:
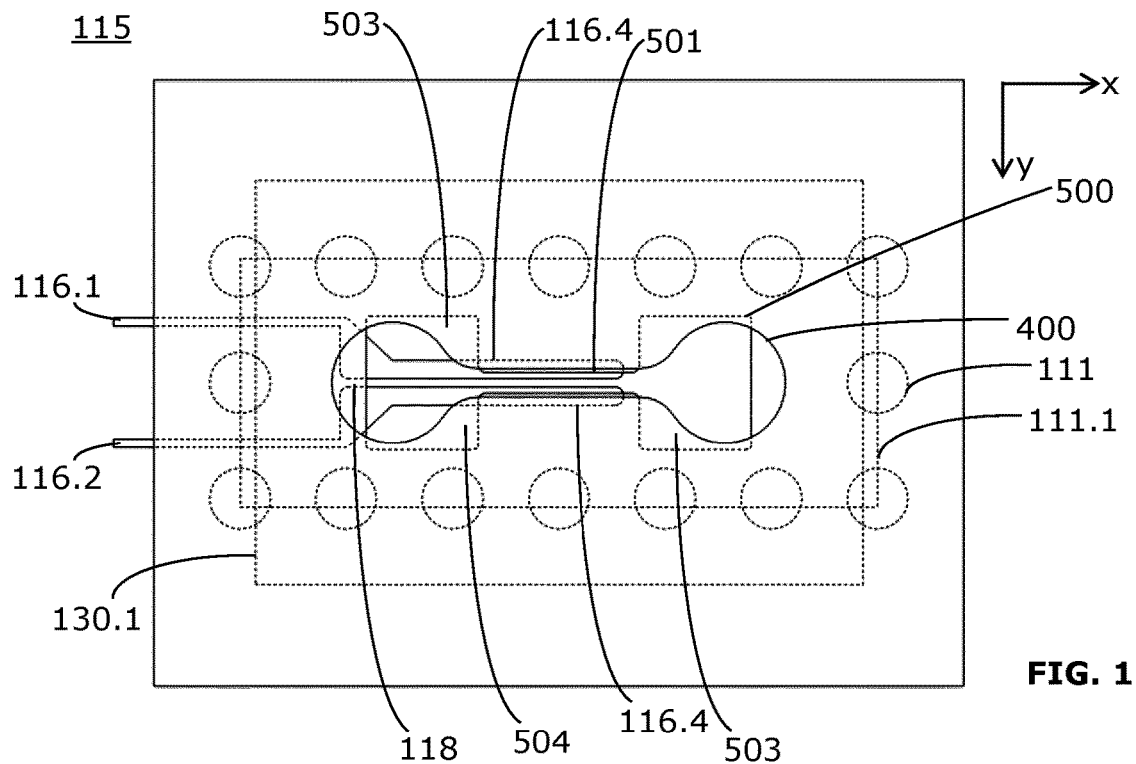
FIG. 13A shows a schematic top view of another embodiment of a unit cell.
Figure 13B:
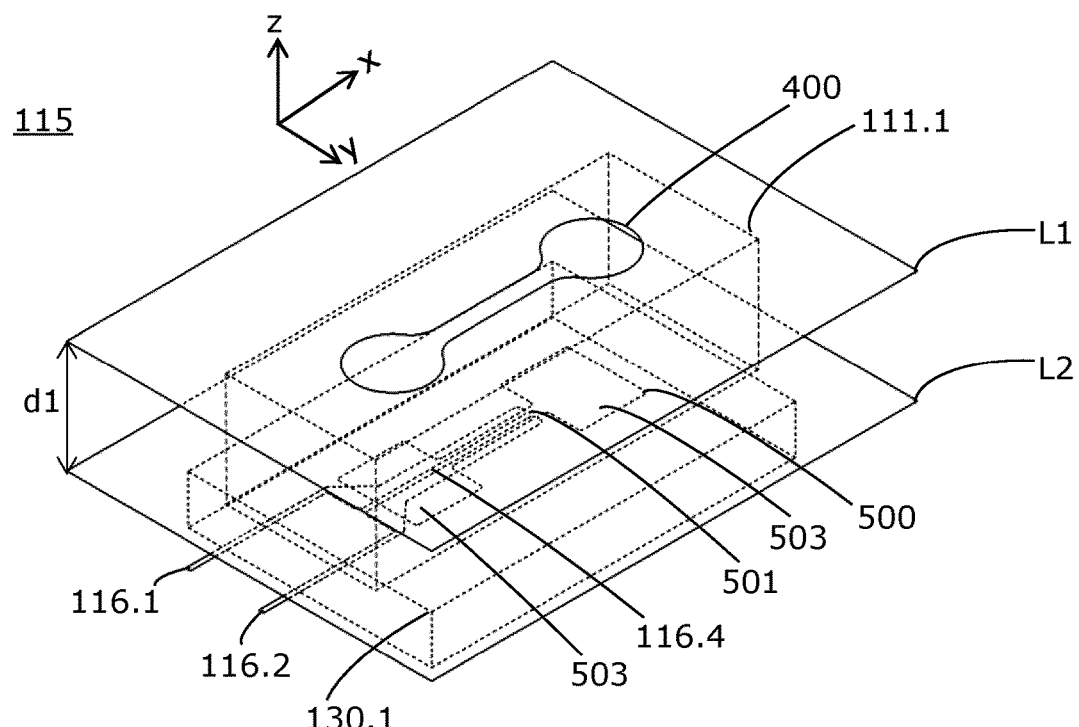
FIG. 13B shows a schematic perspective view of the embodiment of FIG. 13A.

FIG. 13A shows a top view of an embodiment of a unit cell 115 with another balanced microstrip configuration. FIG. 13B shows a respective exploded perspective view. Such a configuration can be used to provide for an efficient transition between the balanced microstrip ports of the IC 120 and the lower slot 500. There is a via fence comprising single rows of through-mode vias 111 situated around the slot 500. The via fence of this embodiment comprises 16 through-mode vias 111. The upper slot 400 has about the same shape as the upper slot 400 in FIG. 4C and the lower slot 500 has about the same shape as the upper slot 400 in FIG. 4C.

The balanced microstrip configuration of FIG. 13A, 13B comprises two thin central signal conductors 116.1, 116.2. Each of these two signal conductors 116.1, 116.2 comprises wider longitudinal end portions 116.4 which are separated by a thin gap 118. One of the longitudinal end portions 116.4 is situated to the left and one of the longitudinal end portions 116.4 to the right of the stretched central portion 501. This configuration provides for an enhanced push-pull capacitive coupling in the transition area. With a length of approximately a quarter wavelength along the central slot portion, it can form a third resonance circuit, meaning it allows triple-tuned bandpass behaviour with proper tuning. Therefore, this arrangement exhibits the largest relative operational bandwidths of all shown configurations. It can cover e.g. a large portion of the so-called E-band (60 GHz-90 GHz), including the communication bands 71 GHz-76 GHz and 81 GHz to 86 GHz, as well as the embedded automotive Radar band 76 GHz-81 GHz and beyond. Therefore, no design variants are necessary for a family of IC 120 chips operating in this frequency band.

It is typical for BGA-based packaging solutions to have well defined pitch and to carry solder balls 130 in a regular grid array.

In order to illustrate the flexibility of the solution presented herein, several BGA pitch and unit cells sizes (i.e. areas which can be placed directly adjacent to each other to form a linear arrangement of closely-spaced waveguide ports) are possible and are addressed in the following.

Figure 14:
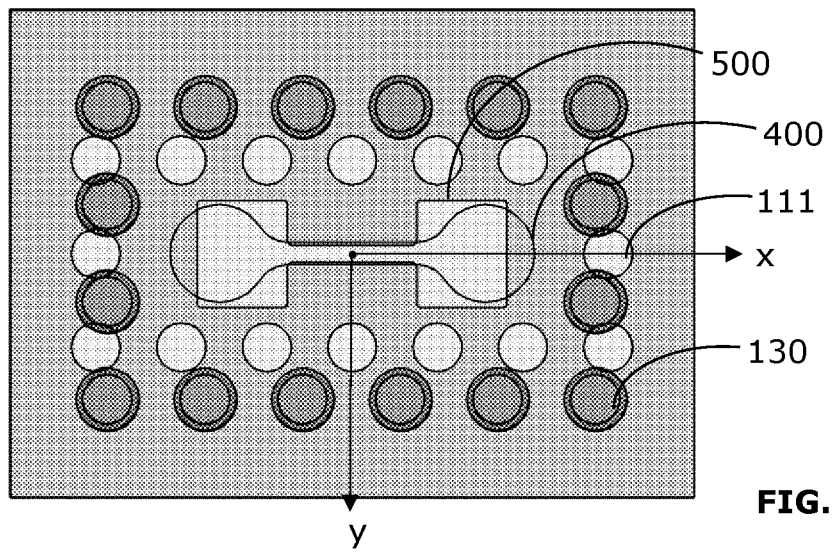
FIG. 14 shows a transparent top view of the of another embodiment of a unit cell.

FIG. 14 shows the top view of a unit cell 115 with a 0.3 mm BGA pitch and with unit cells having the size 1.5 mm×2.1 mm. It is essential to choose the unit cell size in a commensurate way with the BGA pitch. The upper slot 400 of this embodiment has about the same shape as the upper slot 400 in FIG. 4C and the lower slot 500 has about the same shape as the upper slot 400 in FIG. 4C. There are 16 solder balls 130 which are carried by the substrate 170 in a regular grid. 8 solder balls 130 are omitted, i.e. 8 of the regular grid array positions are empty, for accommodating the lower resonant slot 500. The 16 solder balls 130 are arranged in single rows around the transition area of this embodiment. There are 16 vias 111 arranged in single rows around the transition area, too. These vias 111 extend through the molding compound layer 110, as mentioned before. The representation of FIG. 14 gives the impression as if all vias 111 and solder balls 130 would be situated on the same level. But in fact, the solder balls 130 are carried by the substrate 170 and the vias 111 are formed inside the molding compound layer 110. With a unit cell width of 1.5 mm, up to 6 waveguide ports can be placed e.g. along an eWLB package edge of 9 mm length.

Figure 15:
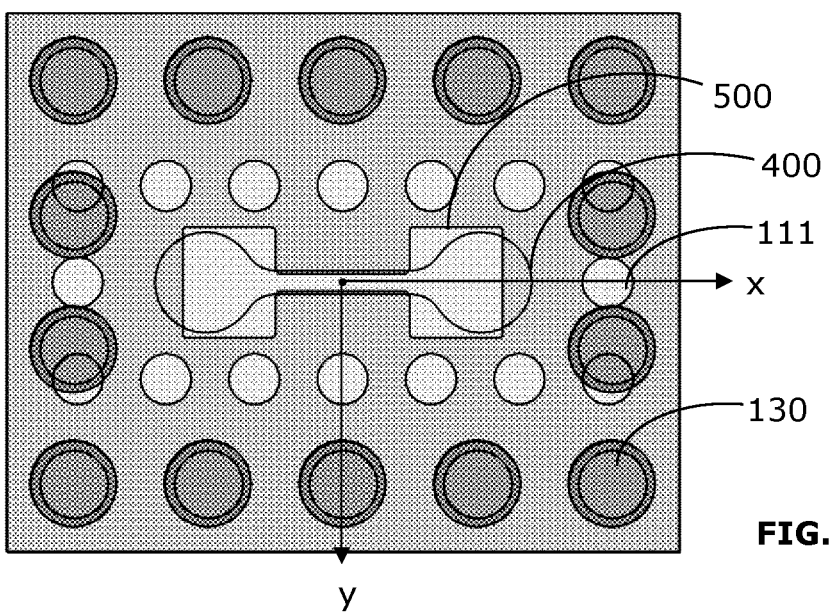
FIG. 15 shows a transparent top view of the transition area of another embodiment of a unit cell.

FIG. 15 shows the top view of a unit cell 115 with a 0.4 mm BGA pitch and with unit cells having the size 1.6 mm×2.0 mm. The constellation of the slots 400, 500 is the same as in FIG. 14. There are 14 solder balls 130 which are carried by the substrate 170 in a regular grid. 6 solder balls 130 are omitted, i.e. 6 of the regular grid array positions are empty. The 14 solder balls 130 are arranged in single rows around the transition area of this embodiment. There are 16 through-mode vias 111 arranged in single rows around the transition area. Typically, encapsulation mold thicknesses d1 vary in certain proportion to the BGA pitch and solder ball size. Also, and quite naturally, the distance between the ground layer, pad or plane 190 and the ground layer, pad or plane 180.1 varies. Both facts can be accommodated by slight re-tuning the slot shapes and dimensions, as well as the mutual distance of the through-mold vias 11 (the latter does not need to be exactly commensurate with the BGA pitch). The unit cell size of this version is slightly larger, therefore 5 waveguides are feasible along a 9 mm eWLB package edge.

Figure 16:
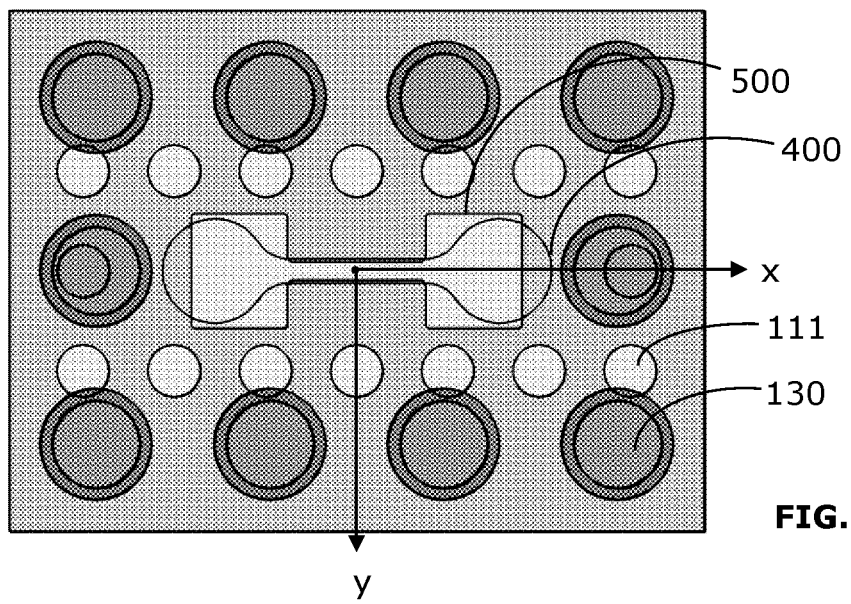
FIG. 16 shows a transparent top view of the transition area of another embodiment of a unit cell.

FIG. 16 shows the top view of a unit cell 115 with a 0.5 mm BGA pitch and with unit cells having the size 1.5 mm×2.0 mm. The constellation of the slots 400, 500 is the same as in FIG. 14. There are 10 solder balls 130 which are carried by the substrate 170 in a regular grid. 2 solder balls 130 are omitted, i.e. 2 of the regular grid array positions are empty. The 10 solder balls 130 are arranged in single rows around the transition area of this embodiment. There are 16 through-mode vias 111 arranged in single rows around the transition area.

Figure 17:
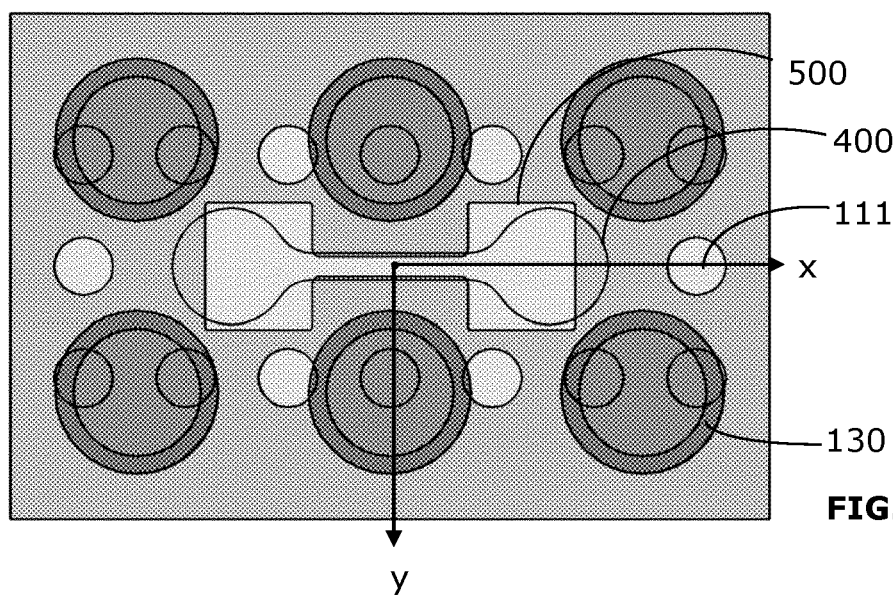
FIG. 17 shows a transparent top view of the transition area of another embodiment of a unit cell.

FIG. 17 shows the top view of a unit cell 115 with a 0.65 mm BGA pitch and with unit cells having the size 1.3 mm×1.95 mm. The constellation of the slots 400, 500 is the same as in FIG. 14. There are 6 solder balls 130 which are carried by the substrate 170 in a regular grid. This configuration is special since none of the solder balls need to be omitted, i.e. all positions of the regular grid array are occupied. There are 16 through-mode vias 111 arranged in single rows around the transition area. The slots 400, 500 are arranged in the space between the solder ball positions in the regular grid array. With this pitch, there is enough space between the solder balls 130 to accommodate a resonant slot 500, without removing some. Nevertheless, waves cannot propagate through the solder ball "fences" within the E-band frequency range, meaning that signal isolation is maintained between adjacent waveguide ports.

FIG. 18A shows a schematic perspective view of an embodiment of an apparatus 100 (e.g. an apparatus 100 with 4 receive (Rx) and 3 transmit (Tx) channels). FIG. 18B shows a top view of the apparatus 100 of FIG. 18A. In the present example, there are four unit cells 115 arranged right next to the border 121.1 of the IC 120 and three unit cells 115 arranged right next to the border 121.2 of the IC 120. FIG. 18B shows the respective arrangement of the unit cells 115.

FIG. 18A just shows the upper slot 400, the lower slot 500 and a signal path 116 of each unit cell 115. One can see in FIG. 18A, 18B that all unit cells 115 are arranged so that their short sides are oriented parallel to the respective border walls 121.1, 121.2, and that the signal paths 116 are extending perpendicularly to these border walls 121.1, 121.2. Underneath the molding compound layer 110 one can see some of the solder balls 130.

FIG. 19 shows an embodiment of a system 150 where three different hollow waveguides 200 are attached to three of the seven unit cells 115 (in FIG. 19 only one unit cell 115 carries a reference number). On the right hand side of the border 121.2 of the IC 120 a first hollow waveguide 200.1 is attached. This waveguide 200.1 comprises an enlarged waveguide portion or segment 213 extending parallel to the negative y-axis and a ridge-waveguide portion or segment 214 oriented parallel to the negative x-axis. The propagation direction P of the waveguide 200.1 is parallel to the x-axis. On the right hand side of the left border 121.1 of the IC 120 a second hollow waveguide 200.2 is attached. This waveguide 200.2 comprises an enlarged waveguide portion or segment 213 extending parallel to the x-axis and a ridge-waveguide portion or segment 214 oriented parallel to the negative y-axis. The propagation direction P of the waveguide 200.2 is parallel to the y-axis. On the left hand side of the left border 121.1 of the IC 120 a third hollow waveguide 200.3 is attached. This waveguide 200.3 comprises an enlarged waveguide portion or segment 213 extending parallel to the negative x-axis and a ridge-waveguide portion or segment 214 oriented parallel to the y-axis. The propagation direction P of the waveguide 200.2 is parallel to the y-axis. The waveguide 200.3 is similar to the one shown in FIG. 7 and described in context with FIG. 7.

While the above describes certain embodiments, those skilled in the art should understand that the foregoing description is not intended to limit the spirit or scope of the present disclosure. It should also be understood that the embodiments of the present disclosure described herein are merely exemplary and that a person skilled in the art may make any variations and modification without departing from the spirit and scope of the disclosure. All such variations and modifications, including those discussed above, are intended to be included within the scope of the disclosure.

The invention claimed is:

1. A microwave system comprising:
   a molding compound layer having opposing first and second surfaces;
   an integrated circuit device being at least partially surrounded by said molding compound layer so as to define a fan-out area located laterally outside of the outline of said integrated circuit device;
   a plurality of vias within said fan-out area extending through said molding compound layer between said first and second surfaces;
   a re-distribution layer stack extending parallel to said second surface and comprising conducting signal paths;
   a substrate comprising a first surface extending parallel to the molding compound layer, and
   an array of solder balls being situated between said substrate and said re-distribution layer stack;
   characterized in that the system comprises:
   two coupling slots being arranged on two different levels of the system so as to resonantly couple with each other,
   at least one hollow waveguide with an open aperture at one end, this waveguide being arranged with the open aperture in the direct proximity of one of said two coupling slots.

2. A system of claim 1, wherein said at least one hollow waveguide is situated
   so that it covers part of said fan-out area, and/or
   so that it does not cover said fan-in area, and/or
   in a border area of said molding compound layer.

3. The system of claim 1, wherein said open (coupling) aperture has the shape of the capital letter "H".

4. The system of claim 1, wherein said at least one hollow waveguide comprises a portion or segment which essentially has the shape of a rectangular box being defined by a width, height, and length, and wherein the width is much shorter than the height, and the width is much shorter than the length.

5. The system of claim 4, wherein a surface of the rectangular box, which is defined by the width and the length, is positioned parallel to a portion of said fan-out area.

6. The system of claim 1, wherein said at least one hollow waveguide is arranged with its H-plane perpendicular to said first surface.

7. The system of claim 1, wherein said at least one hollow waveguide is arranged so that a narrow side or wall of an airbox defining said waveguide is oriented parallel to said first surface.

8. The system of claim 1, wherein said at least one hollow waveguide has an orientation parallel to said first surface or an orientation perpendicular to said first surface.

9. The system of claim 1, wherein
   said re-distribution layer stack comprises a first ground layer, pad or plane on a lower surface facing said substrate,
   said substrate comprises at an upper surface facing said re-distribution layer stack a third ground layer, pad or plane,
   a lower one of said two coupling slots is realized in this first ground layer, pad or plane, and wherein
   some of said solder balls connect said first ground layer, pad or plane to said third ground layer, pad or plane.

10. The system according to claim 9, comprising a second ground layer, pad or plane which is situated at or close to the first surface of said molding compound layer, wherein
an upper one of said two coupling slots is realized in this second ground layer, pad or plane, and wherein
at least some of said vias connect said first ground layer, pad or plane to said second ground layer, pad or plane.

11. The system of claim 1, wherein the plurality of vias is arranged in said molding compound layer so as to form a conductive via fence around said two coupling slots.

12. The system of claim 11, wherein said conductive via fence comprises one or two parallel rows of vias.

13. The system of claim 1, wherein
said solder balls are carried by said substrate in a regular grid,
underneath one of said coupling slots at least one of the solder balls at one array position of the regular grid is omitted, and wherein
the solder balls situated around said position form or define a ball-delimited backshort cavity.

14. The system of claim 1, wherein
said solder balls are carried by said substrate in a regular grid with all of the positions of the regular grid within a unit cell being occupied by solder balls,
one of said coupling slots is situated in a space between several of said solder balls, and wherein
these solder balls form or define a ball-delimited backshort cavity.

15. The system of claim 1, wherein said molding compound layer is designed so as to serve as dielectric filled waveguide section confined by the plurality of vias, and wherein this dielectric filled waveguide section electromagnetically couples the two coupling slots of the System.

16. The system of claim 1, wherein a conducting signal path protrudes into an area of the lower of the two coupling slots and either provides for a capacitive coupling feature of the lower of the two coupling slots, or makes a galvanic contact to the lower of the two coupling slots.

17. A microwave apparatus comprising
a molding compound layer;
an integrated circuit device being at least partially surrounded by material of said molding compound layers so as to define a fan-out area located laterally outside of the outline of said integrated circuit device;
n unit cells, with n being a natural number, wherein each of said n unit cells comprises
a first ground layer, pad or plane in which a lower coupling slot is provided,
a second ground layer, pad or plane in which an upper coupling slot is provided,
wherein material of said molding compound layer is situated between said first ground layer, pad or plane and said second ground layer, pad or plane,
wherein
said n unit cells are placed around the outline of said integrated circuit device, and wherein
each of said n unit cells is designed for being coupled to a hollow waveguide.

18. An apparatus according to claim 17, further comprising a glue or adhesive for mounting hollow waveguides above said molding compound layer.

19. The apparatus according to claim 17, being designed for mounting n hollow waveguides in a fan-out constellation, where for each of said n unit cells there is one hollow waveguide.

20. The apparatus according to claim 18, being designed for mounting n hollow waveguides in a fan-out constellation, where for each of said n unit cells there is one hollow waveguide.

* * * * *